United States Patent
Maekawa

(10) Patent No.: US 7,989,272 B2
(45) Date of Patent: Aug. 2, 2011

(54) COMPOSITION OF CARBON NITRIDE, THIN FILM TRANSISTOR WITH THE COMPOSITION OF CARBON NITRIDE, DISPLAY DEVICE WITH THE THIN FILM TRANSISTOR, AND MANUFACTURING METHOD THEREOF

(75) Inventor: Shinji Maekawa, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 173 days.

(21) Appl. No.: 12/149,130

(22) Filed: Apr. 28, 2008

(65) Prior Publication Data
US 2008/0206909 A1  Aug. 28, 2008

Related U.S. Application Data

(62) Division of application No. 10/787,551, filed on Feb. 27, 2004, now abandoned.

(30) Foreign Application Priority Data

Feb. 28, 2003  (JP) ................................. 2003-054179

(51) Int. Cl.
*H01L 21/00*  (2006.01)
(52) U.S. Cl. ................ 438/149; 438/151; 257/E51.005; 257/E51.006
(58) Field of Classification Search .................. 438/149, 438/151, 475, 485; 257/E21.599, E21.625, 257/E51.005, E51.006
See application file for complete search history.

(56) References Cited

U.S. PATENT DOCUMENTS 4,210,390 A  7/1980 Yaguchi
4,869,923 A  9/1989 Yamazaki
(Continued)

FOREIGN PATENT DOCUMENTS
JP  0 473 492  3/1992
(Continued)

OTHER PUBLICATIONS

Ohkawara et al., "Quantitative Analysis of Hydrogen in Amorphous Films of Hydrogenated Carbon Nitride," Jpn. J. Appl.Phys., 40, 2001, pp. 7007-7012.*

*Primary Examiner* — Asok K Sarkar
*Assistant Examiner* — Julia Slutsker
(74) *Attorney, Agent, or Firm* — Eric J. Robinson; Robinson Intellectual Property Law Office, P.C.

(57) ABSTRACT

A conventional composition of carbon nitride has a deposition method and properties limited. In the case of using the composition of carbon nitride as a protective film, for example, a material of an object to be coated (goods) is required to satisfy with a condition in disagreement with a temperature during forming the composition of carbon nitride. Besides, in the case of using the composition of carbon nitride as an insulating film in a semiconductor device, low stress relaxation and low coverage for a step are produced since the insulating film has a low hydrogen concentration. Consequently, a composition including carbon nitride according to the present invention is formed at a deposition temperature that enables to include hydrogen in the composition at 30 to 45 atomic %, for example, at temperatures of 100° C. or less, preferably 50° C. or less, more preferably from 20° C. to 30° C., with stability and adhesiveness kept.

10 Claims, 11 Drawing Sheets

U.S. PATENT DOCUMENTS

| | | | |
|---|---|---|---|
| 5,015,494 | A | 5/1991 | Yamazaki |
| 5,026,415 | A | 6/1991 | Yamamoto et al. |
| 5,120,625 | A | 6/1992 | Yamazaki et al. |
| 5,145,711 | A | 9/1992 | Yamazaki et al. |
| 5,230,931 | A | 7/1993 | Yamazaki et al. |
| 5,873,984 | A | 2/1999 | Cheng et al. |
| 6,245,417 | B1 | 6/2001 | Huang |
| 6,306,694 | B1 | 10/2001 | Yamazaki et al. |
| 6,346,730 | B1 | 2/2002 | Kitakado et al. |
| 6,388,366 | B1 | 5/2002 | Pryor |
| 6,399,988 | B1 | 6/2002 | Yamazaki |
| 6,428,762 | B1 | 8/2002 | Khabashesku et al. |
| 6,579,736 | B2 | 6/2003 | Yamazaki |
| 6,709,902 | B2 | 3/2004 | Kitakado et al. |
| 6,777,716 | B1 | 8/2004 | Yamazaki et al. |
| 6,844,227 | B2 | 1/2005 | Kubo et al. |
| 6,878,968 | B1 | 4/2005 | Ohnuma |
| 7,244,972 | B2 | 7/2007 | Kubo et al. |
| 7,279,239 | B2 * | 10/2007 | Akedo et al. ................ 428/704 |
| 2002/0098628 | A1 * | 7/2002 | Hamada et al. .............. 438/149 |
| 2002/0179908 | A1 * | 12/2002 | Arao ............................... 257/72 |
| 2002/0190257 | A1 * | 12/2002 | Yamazaki et al. ............. 257/72 |
| 2003/0080338 | A1 | 5/2003 | Yamazaki et al. |
| 2003/0080436 | A1 | 5/2003 | Ishikawa |
| 2003/0102490 | A1 * | 6/2003 | Kubo et al. ................... 257/192 |
| 2004/0241964 | A1 * | 12/2004 | Sugino et al. ................ 438/475 |

FOREIGN PATENT DOCUMENTS

| | | |
|---|---|---|
| JP | 05-073900 | 3/1993 |
| JP | 09-255314 | 9/1997 |
| JP | 10-008257 A | 1/1998 |
| JP | 10-018040 A | 1/1998 |
| JP | 11-504753 | 4/1999 |
| JP | 11-238684 | 8/1999 |
| JP | 2000-349299 A | 12/2000 |
| JP | 2002-502081 A | 1/2002 |
| JP | 2002-270834 A | 9/2002 |
| WO | WO-99/03099 | 1/1999 |
| WO | WO-03/005432 * | 1/2003 |

* cited by examiner

Fig. 2A
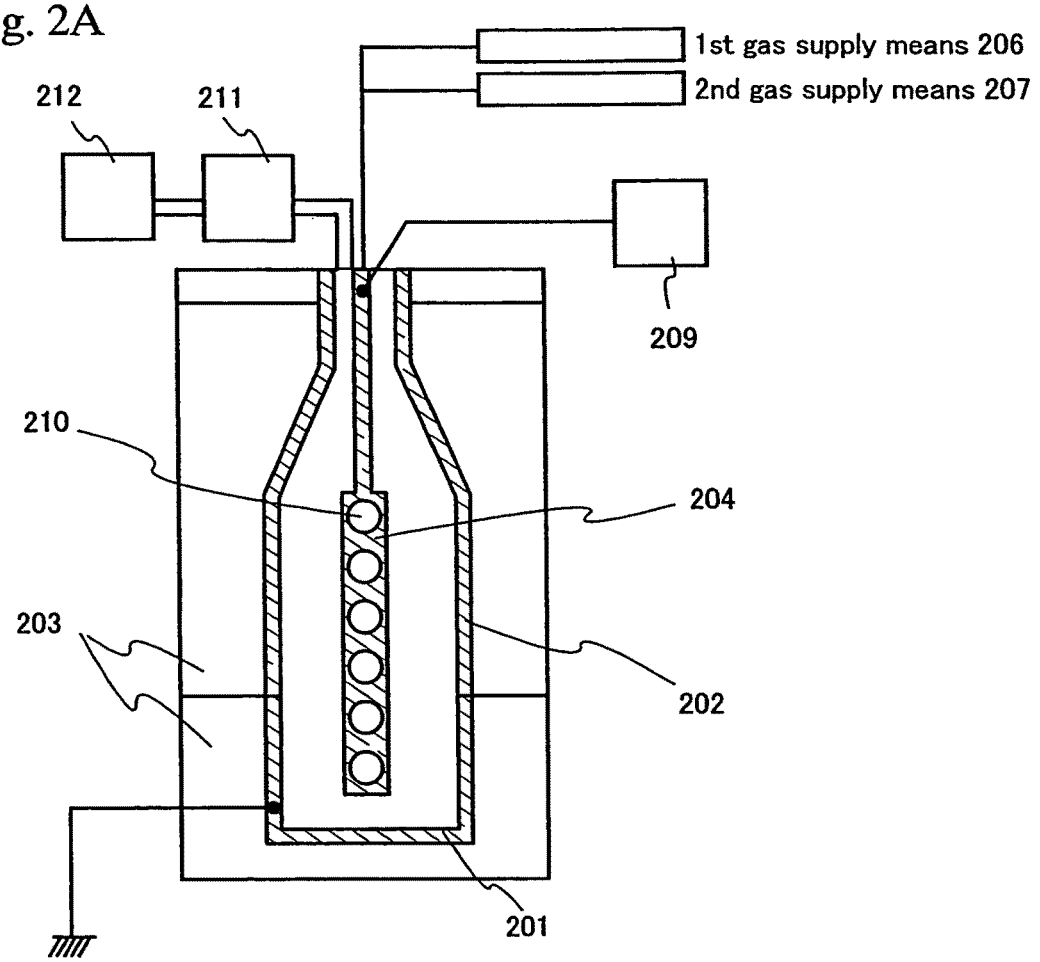
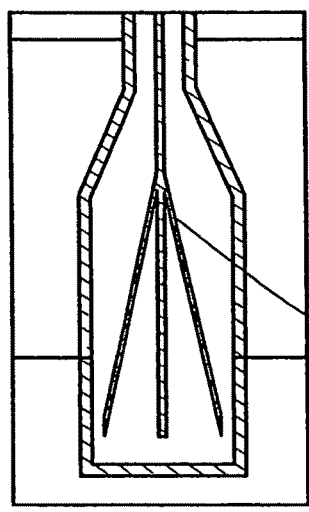
Fig. 2B
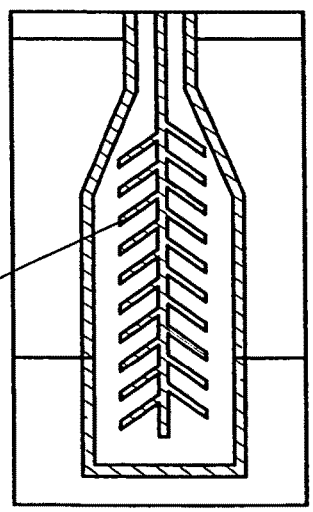
Fig. 2C

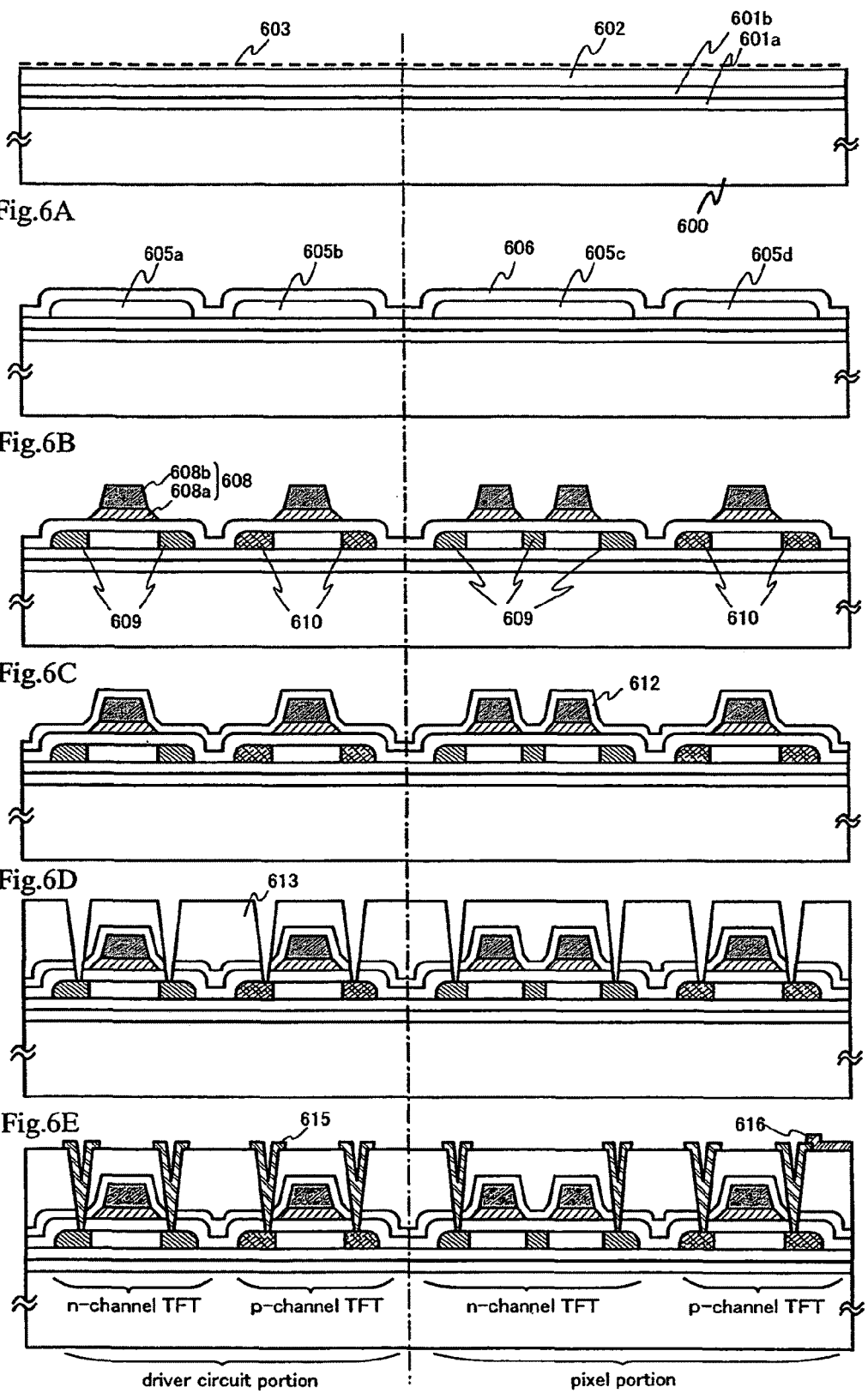

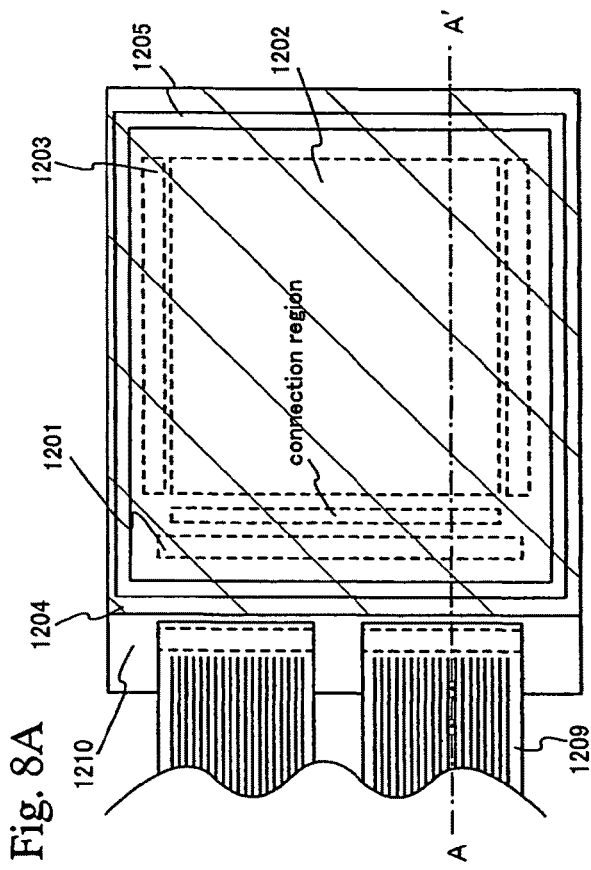
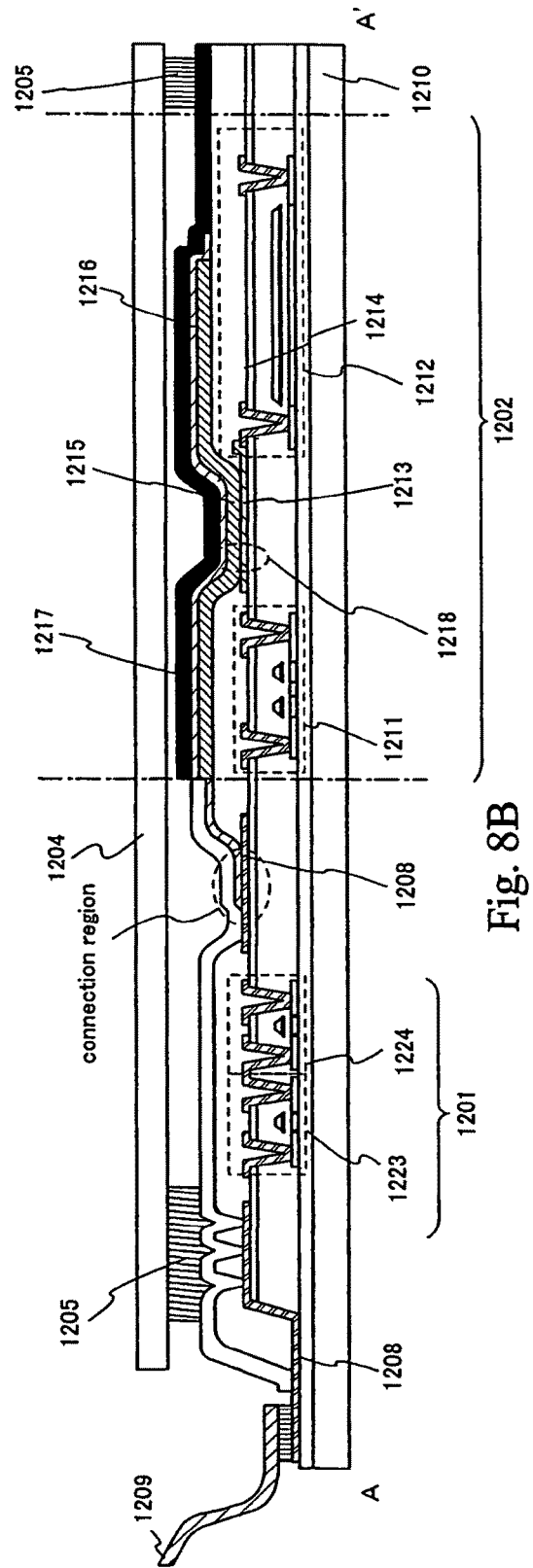
Fig. 8A
Fig. 8B

COMPOSITION OF CARBON NITRIDE, THIN FILM TRANSISTOR WITH THE COMPOSITION OF CARBON NITRIDE, DISPLAY DEVICE WITH THE THIN FILM TRANSISTOR, AND MANUFACTURING METHOD THEREOF

BACKGROUND OF THE INVENTION

1. Field of the Invention

The present invention relates to a composition including carbon nitride, which can be formed at a low temperature and is suitable, and a method of manufacturing thereof.

Additionally, the present invention also relates to goods such as containers for food or beverage, and electronic parts, which are coated with a composition including carbon nitride according to the present invention. Moreover, the present invention relates to a thin film transistor that has the composition including carbon nitride as an insulating film such as an interlayer insulating film, a base film, or the other insulating film; a display device, a liquid crystal display device, and the other display device, which comprise the thin film transistor; and methods for manufacturing thereof.

2. Description of the Related Arts

Conventionally, research has been conducted in wide range of fields while making use of properties of a composition of carbon nitride.

Typically, there is a field that relates to a technique of coating with a protective film for protecting various goods from external damage and reducing friction resistance. For example, a secondary or tertiary amine is used with plasma CVD at an ambient temperature to have a hydrogen content reduced and form a CN (carbon nitride) film with more single bonds of nitrogen and carbon (Japanese Patent Laid-Open No. 9-255314), and a CN film is formed with sputtering (Published Japanese Translations of PCT International Publication for Patent Applications No. 11-504753).

Further, research has been conducted also in relation to a field of semiconductor. In the field of semiconductor in late years, with miniaturization, a high dielectric constant of an insulating film is considered to be a cause of circuit delay, and an attempt to use a composition of carbon nitride, which is expected to have a low dielectric constant, as an insulating film has been made. For example, a silicon substrate is subjected to reactive sputtering and hydrogen plasma treatment to form a composition of an amorphous carbon nitride film as an insulating film used for a semiconductor element (Japanese Patent Laid-Open No. 11-238684).

However, a conventional composition of carbon nitride has a deposition method and properties limited. In the case of using the composition of carbon nitride as a protective film, for example, a material of an object to be coated (goods) is required to satisfy with a condition in disagreement with a temperature during forming the composition of carbon nitride. Namely, the composition of carbon nitride has stability dropped as the deposition temperature is lowered. In result, the deposition method of the composition of carbon nitride has a degree of freedom limited by the material of the object to be coated. In particular, in the case of a resin material such as a plastic bottle, which has a low softening point, it is difficult to set a low deposition temperature although it is desired to avoid a high deposition temperature in view of the material. As a result of further producing an increase in deposition temperature, it takes a long time to set a constant high temperature and to cool down.

SUMMARY OF THE INVENTION

It is an object of the present invention to provide composition including carbon nitride efficiently, which has a high barrier against gas, stability, and high coverage and adhesiveness in spite of deposition at a low temperature. Specifically, it is an object of the present invention to provide containers for food or beverage such as a plastic bottle and electronic members (parts) with high ruggedness and low friction resistance such as a CD-ROM, a magnetic head, a photoreceptor drum, which have a composition including carbon nitride according to the present invention, and a method of manufacturing thereof.

Besides, an insulating film in a semiconductor device typified by a conventional thin film transistor produces low stress relaxation and low coverage for a step since the insulating film has a low hydrogen concentration. In particular, as the insulating film is formed at lower temperature, hydrogen in the film is easy to be released for desorption, and therefore, hydrogen is released for desorption in a heat process later to bring peeling and dropped adhesiveness. Accordingly, a method for forming the insulating film has a degree of freedom limited by a material of a semiconductor element and a material of a display element provided on the semiconductor element.

For example, in the case of forming an organic light-emitting layer (a light-emitting layer that has an organic compound), forming an electrode on the organic light-emitting layer, and forming an insulating film on the electrode as a protective film in order to prevent degradation of the organic light-emitting layer, there is the possibility of degradation of the organic light-emitting layer as a temperature for the formation becomes higher. In addition, the organic light-emitting layer has a problem of degradation due to moisture and oxygen, and a problem with emission of hydrogen and oxygen from films such as the protective film and an interlayer insulating film.

Moreover, in late years, research has been conducted on a method of forming a semiconductor element on a flexible substrate to form a light and thin display device. As the flexible substrate, an organic resin material is often used, and it is desirable to avoid forming an interlayer insulating film, a protective film, a base insulating film, and a gate insulating film on the plastic substrate at a high temperature.

It is an object of the present invention to use a composition including carbon nitride according to the present invention, which has high coverage and adhesiveness and can be formed at a low temperature, for insulating films of all kinds of semiconductor devices and display devices.

In view of the object above, a composition including carbon nitride according to the present invention is formed at a deposition temperature that enables to include hydrogen in the composition at 30 to 45 atomic %, for example, at temperatures of 100° C. or less, preferably 50° C. or less, more preferably from 20° C. to 30° C., with stability and adhesiveness kept.

Further, a composition including carbon nitride according to the present invention includes hydrogen, nitrogen, and carbon, and the hydrogen has a composition ratio from 30 to 45 atomic %, preferably, 35 to 40 atomic %. Therefore, the nitrogen and the carbon included in the composition except the hydrogen have a composition ratio from 55 to 70 atomic % in total. In the case of using stable gas such as nitrogen as reactant gas, in the range, the nitrogen has a composition ratio from 10 to 20 atomic % and the carbon has a composition from 40 to 50 atomic %. In the case of using gas such as nitride gas, which is easy to decompose, the nitrogen has a composition ratio from 35 to 45 atomic % and the carbon has a composition from 15 to 20 atomic %. Needless to say, the hydrogen, the nitrogen, and the carbon take the respective composition ratios assuming that the composition has a composition ratio of 100 atomic % in total.

According to the present invention, vapor-phase growth (vapor phase epitaxy) is used with a mixture of carbide gas that is easily dissociated with plasma and one of nitrogen gas and nitride gas to form a composition including carbon nitride in order to include hydrogen in the composition including carbon nitride. As the vapor-phase growth, a method of dissociating or separating the carbide gas with a plasma generator may be used, and any plasma CVD such as high-frequency discharge plasma CVD, microwave plasma CVD, or electron cyclotron resonance (ECR) plasma CVD can be used. As the carbide gas, a material that can be represented by CxHy may be used, and $C_2H_2$ or $C_2H_4$ may be used, for example. As the nitride gas, a material that can be represented by NxHy may be used, and $NH_3$ may be used, for example.

Besides, in the present invention, sputtering that can form a composition including carbon nitride and a lot of hydrogen may be employed. For example, sputtering in which into gas such as nitrogen, ammonia, and hydrogen is mixed into sputtering gas and graphite carbon is used as a target may be adopted. In other words, the present invention is characterized by a hydrogen concentration of a composition including carbon nitride, and is not limited by a means for manufacturing the composition.

Such a composition including carbon nitride with a high hydrogen concentration produces enhanced stress relaxation and has a high coverage also for a curved object to be coated and objects to be coated in the other shapes.

As a means for determining stability of a composition including carbon nitride, an amount of released hydrogen is considered. Even though a composition including carbon nitride according to the present invention is deposited at temperatures 100° C. or less and includes a lot of hydrogen, an amount of emitted hydrogen is extremely small even when the composition including carbon nitride is heated at temperatures from 450° C. to 600° C.

The composition including carbon nitride according to the present invention, which emits few amounts of hydrogen during being heated, has high stability, low reactivity to a material in contact with the composition, and is appropriate for a protective film. The fact of emitting an extremely small amount of hydrogen that has the smallest atomic radius indicates that an extremely small amount of gas passes through the composition including carbon nitride and the composition has a really high barrier against gas.

According to the present invention as described above, in the case of using the composition including carbon nitride as a protective film, an object to be coated has a degree of freedom enhanced, and the composition can be deposited especially for an organic resin material represented by plastic. Then, goods coated with the composition including carbon nitride according to the present invention is superior in abrasion resistance and friction characteristics, and accordingly, the goods can have a life improved.

Since the composition especially has a high barrier for gas, it is preferable to use the composition as a protective film of a container for food or beverage. Especially, it is preferable to use the composition including carbon nitride according to the present invention for a protective film of a plastic bottle or a packaging container or bag for food. Since a current packaging container or bag for food is coated with an aluminum material in order to improve a barrier against gas, it is not possible to check the food at the time of purchase. On the other hand, the composition including carbon nitride according to the present invention has translucency, food can be checked at the time of purchase and consumer appetite can be expected to enhance.

In addition, a composition including carbon nitride according to the present invention may be amorphous or polycrystalline for any purpose.

Besides, the present invention provides a thin film transistor that has at least one of an interlayer insulating film, a base film, a protective film, and the other insulating films, which include the composition including carbon nitride as described above, and a display device (including a display module) that has the thin film transistor.

As described above, a composition including carbon nitride according to the present invention can be formed at temperatures of 100° C. or less, preferably 50° C. or less, more preferably from 20° C. to 30° C., the composition is appropriate for an insulating film of a thin film transistor formed over a film substrate.

Besides, in the case of a display device that has a light-emitting element, a composition including carbon nitride according to the present invention can be used for at least one of an interlayer insulating film, a gate insulating film, and a base film to reduce an effect of moisture on an organic light-emitting layer. Further, the composition is appropriate for a protective film on a cathode of a display device that has a light-emitting element.

BRIEF DESCRIPTION OF THE DRAWINGS

In the accompanying drawings:

FIGS. 2A to 2C are diagrams showing a CVD system for coating with a composition including carbon nitride according to the present invention;

FIGS. 6A to 6F are diagrams showing a process of manufacturing a thin film transistor with the use of a composition including carbon nitride according to the present invention;

FIGS. 8A and 8B are diagrams showing a display device that has a light-emitting element, which is provided with a thin film transistor according to the present invention;

DESCRIPTION OF THE INVENTION

Embodiment Mode

Hereinafter, embodiment modes according to the present invention will be described with reference to the drawings. In all of the drawings for describing the embodiment modes, the same reference number is assigned to the same portions or portions that have the same function, a repetitive explanation will be omitted.

Embodiment Mode 1

In the present embodiment mode, a method of forming a composition including carbon nitride will be described with reference to FIG. 1.

Figure 1:
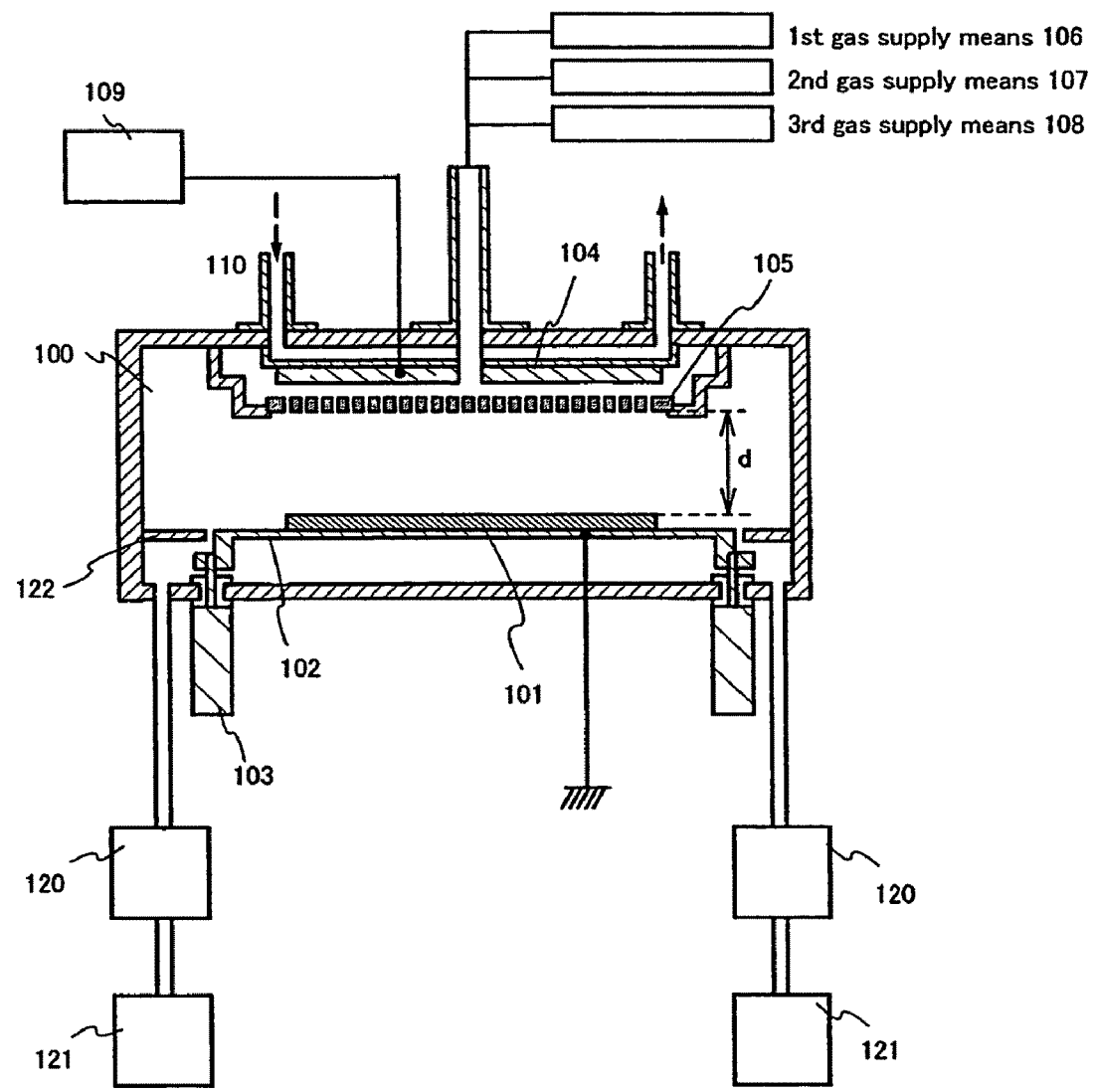
FIG. 1 is a diagram showing a CVD system for forming a composition including carbon nitride.

A plasma CVD system shown in FIG. 1 has a deposition chamber 100 provided with an grounded stage 102 for fixing an object to be coated 101 and an up and down mechanism 103 for moving the stage 102 up and down. Since the stage 102 has a function as an electrode, a material including metal is preferably used to form the stage 102. Of course, a stage and an electrode may respectively be arranged. Note that the object to be coated includes goods to which a composition including carbon nitride is deposited, and a substrate over which a semiconductor element represented by a thin film transistor.

An opposed electrode 104 is provided in a position opposing to the object to be coated 101 with an electrode provided with openings for blowing gas (a shower head) 105 therebetween. The opposed electrode 104 may have a stainless material and the shower head 105 may have an aluminum material, for example. The number of openings for blowing gas may be appropriately set. Alternatively, a plurality of shower heads may be provided to overlap with each other, and the shower head at the side of the object to be coated may differ in the number of openings form the shower head at the side of the opposed electrode. Also, the opening may have a diameter reduced toward the side of the object to be coated to enable diffusing reaction gas uniformly. Furthermore, an electrode that doubles as a shower head and an electrode, which is a hollow conductive material provided with openings for blowing gas, may be provided.

In order to control a temperature, the opposing electrode 104 is provided with a means for controlling a temperature 110 such as a heating means and a cooling means. As the cooling means, cooling water flowing in a piping drawing is used, for example, thereby to make it possible to cool the opposed electrode 104 rapidly or slowly.

In addition, a high-frequency power source 109 is connected to the opposed electrode 104, and a high-frequency wave (for example, 13.56 MHz) is applied. Moreover, a matching box for adjusting and controlling a frequency and a phase may be provided.

In a predetermined position of the deposition chamber 101 (preferably, a top surface), an opening for supplying material gas (supply port) is provided, and mixed material gas is supplied from a plurality of material gas supply means (for example, first to third gas supply means 106 to 108). Further, gas for cleaning such as $NF_3$ or $O_2$ may be supplied from any of gas supply means to perform deposition and cleaning alternately.

Besides, a portion of the opposed electrode 104 is provided with an opening for supplying gas, and material gas is supplied to the vicinity of the object to be coated 101 through the openings of the shower head. A distance "d" between the opposing substrate 104 and the object to be coated 101 is set at several centimeters (preferably, 3 to 5 cm). In result, plasma is generated within a limited range and deposition can be conducted efficiently.

As material gas in the present embodiment mode, gas including carbide gas such as acetylene ($C_2H_2$) or ethylene ($C_2H_4$) and nitrogen ($N_2$) gas or nitride gas such as ammonia ($NH_3$) is used. Particularly, acetylene is expected to have higher reactivity then methane ($CH_4$) since acetylene has a triple bond of carbon. In terms of a flow rate of the material gas, the carbide gas may have an appropriate flow rate set from 20 sccm to 50 sccm and the nitrogen gas or the nitride gas may have an appropriate from rate from 150 sccm to 350 sccm.

In a predetermined position of the deposition chamber 101 (preferably, a bottom surface), a rotary pump 120 and a dry pump 121 (may be a turbo pump) are provided as an exhaust means for exhausting gas. Although the CVD system has a plurality of exhaust means provided in the present embodiment mode, one exhaust means may be provided. The pressure in the deposition chamber 100 is controlled by the exhaust means to be set appropriately from 0.1 Torr to 1 Torr.

In addition, it is preferable to provide a current plate 122 at the periphery of the stage 102 in the deposition chamber 100. When the current plate is provided, generated plasma can be efficiently limited in a reaction region. Moreover, the current plate can also be used for controlling a flow rate and a direction of gas flowing into the exhaust means.

In such a deposition chamber, an object to be coated is arranged on the stage, and a composition including carbon nitride is formed. It is preferable to form a composition including carbon nitride on a substrate on the grounded stage since plasma charge is small. However, a composition including carbon nitride according to the present invention can be formed also in the case of arranging an object to be coated on a stage connected to a high-frequency power source. In this case, self-bias can be applied to a substrate, and hardness of a composition including carbon nitride can be further controlled.

In the case of forming a composition including carbon nitride on any of a substrate arranged on an grounded stage and a substrate connected to a high-frequency power source, hardness of a composition including carbon nitride can be gradually (continuously or by stages) heightened or lowered by controlling gas flow rate, pressure, and applied voltage. In result, it becomes possible to improve adhesiveness.

With the use of the CVD system (vapor-phase reaction deposition system) as described above, a composition including carbon nitride is formed at temperatures of 100° C. or less, preferably 50° C. or less, more preferably from 20° C. to 30° C. More specifically, a composition including carbon nitride can be manufactured without heating the deposition chamber. However, it is believed that the electrode to which a high-frequency wave is applied is heated on some level.

Since a composition including carbon nitride according to the present invention can be formed at a low temperature, it is possible to coat various objects with the composition including carbon nitride and to form the composition including carbon nitride as an insulating film of a semiconductor element without considering properties of an object to be coated. Further, the efficiency in deposition is improved since it is unnecessary to set the deposition temperature at a constant high temperature or to cool down.

Since the thus formed composition including carbon nitride has hydrogen from 30 to 45 atomic %, preferably from 35 to 40 atomic %, stress relaxation is enhanced. Accordingly, the composition including carbon nitride can be uniformly formed without peeling when an object to be coated has not only a shape of a planar surface but also a shape of curved surface.

In the case of using a composition including carbon nitride according to the present invention as a protective film or an insulating film of a semiconductor element, a structure of a laminate of the composition including carbon nitride and another film (for example, a nitride film or an oxide film) may be employed. Further, since a composition including carbon nitride according to the present invention has high adhesiveness, it becomes possible to deposit the composition including carbon nitride on an object to be coated without a buffer layer interposed therebetween.

According to the present invention, it is possible to deposit an inexpensive composition including carbon nitride, which has stable ruggedness and is appropriate for mass production, at low temperatures of 100° C. or less, preferably 50° C. or less, more preferably from 20° C. to 30° C.

Embodiment Mode 2

In the present embodiment mode, a case of depositing a composition including carbon nitride for a plastic bottle as a protective film of a specific commercial product will be described.

As shown in FIG. 2A, a plastic bottle 201 that becomes an object to be coated is fixed to a chamber 203. Specifically, the chamber 203 that can be separated into an in an upper portion and a lower portion is prepared, and an external electrode 202 is provided at a surface in contact with the plastic bottle 201. Then, the plastic bottle 201 is set in the lower portion and then, covered with the upper portion to fix the plastic bottle 201 in the chamber 203.

The plastic bottle 201 is formed of a material selected form thermoplastic resin such as polyethylene resin, polystyrene resin, polymethylpentene, vinyl chloride resin, and polyethylene terephthalate, and thermoset resin such as phenol resin.

After that, a tube for supplying material gas is inserted from above of the plastic bottle 201. Since the pipe doubles as an internal electrode 204, it is preferable to use the material including a metal to form the pipe. In the present embodiment mode, the pipe is connected to first and second gas supply means 206 and 207, mixed material gas is supplied into the plastic bottle 201 through the pipe. The gas supply means may be appropriately set, and a single gas supply means, or three or more may be provided. Additionally, it is preferable that the pipe has a side provided with a plurality of openings 210 for supplying gas in order to supply gas uniformly into the plastic bottle 201. Besides, a rotary pump 211 and a dry pump 212 (may be a turbo pump) are provided as an exhaust means for exhausting gas.

The external electrode 202 is arranged at the side surface of the chamber 203 in contact with the plastic bottle 201, and the internal electrode 204 is connected to a high-frequency power source 209. A high-frequency wave with a frequency of 13.56 MHz is applied from the high-frequency power source 209 to generate plasma. Then a carbon ion, a nitrogen ion, and a hydrogen ion are attracted to an inside of the plastic bottle neighboring the external electrode, and the inside is coated with a composition including carbon nitride with a thickness approximately from 10 nm to 100 nm.

FIGS. 2B and 2C show internal electrodes in different shapes from the shape the internal electrode (tube) 204 in FIG. 2A, and the other elements such as an external electrode, are the same as those provided in FIG. 2A. In FIG. 2B, an internal electrode that serves as an axis is provide with an electrode extending toward a base plane of the plastic bottle. The internal electrode that severs as an axis and the extending electrode provided with internal electrode may be fixed to have an angle made by the internal electrode and the extending electrode approximately from 10 degree to 30 degree, or may be designed to have an angle by pressure in blowing material gas. Alternatively, as the internal electrode shown in FIG. 2C, an internal electrode that serves as an axis may be provided with a plurality of electrodes extending toward a base plane of the plastic bottle, which are provided at plural parts of the internal electrode that serves as an axis. When such shapes of the internal electrode are employed, a plastic bottle can be coated more uniformly.

The internal electrode may not have a shape of a bar (column shape), and may be formed along a curved surface of the plastic bottle. Moreover, in the CVD systems shown in FIGS. 2A to 2C, the internal electrode is preferably spun to form an uniform protective film.

As above, the case of a single plastic bottle is described in the present embodiment mode. However, it is conceivable that plural plastic bottles are coated at the same time in order to enhance productivity.

Further, although coating is performed with an opening of the plastic bottle up in the present embodiment mode, the plastic bottle may be coated with the opening down.

Since a composition including carbon nitride according to the present invention is sufficiently adhesive to a surface of a plastic bottle, includes relatively a lot of hydrogen, and produces stress relaxation, it is possible to reduce failures in coating (such as a crack) caused by deformation of plastic.

The plastic bottle coated in this way has a high barrier against oxygen and carbon, and is stable chemically. Therefore, the plastic bottle has no harmful influence on drinking water in the plastic bottle.

Embodiment Mode 3

In the present embodiment mode, a case of depositing a composition including carbon nitride for a plurality of objects to be coated as a protective film win be described.

Figure 3:
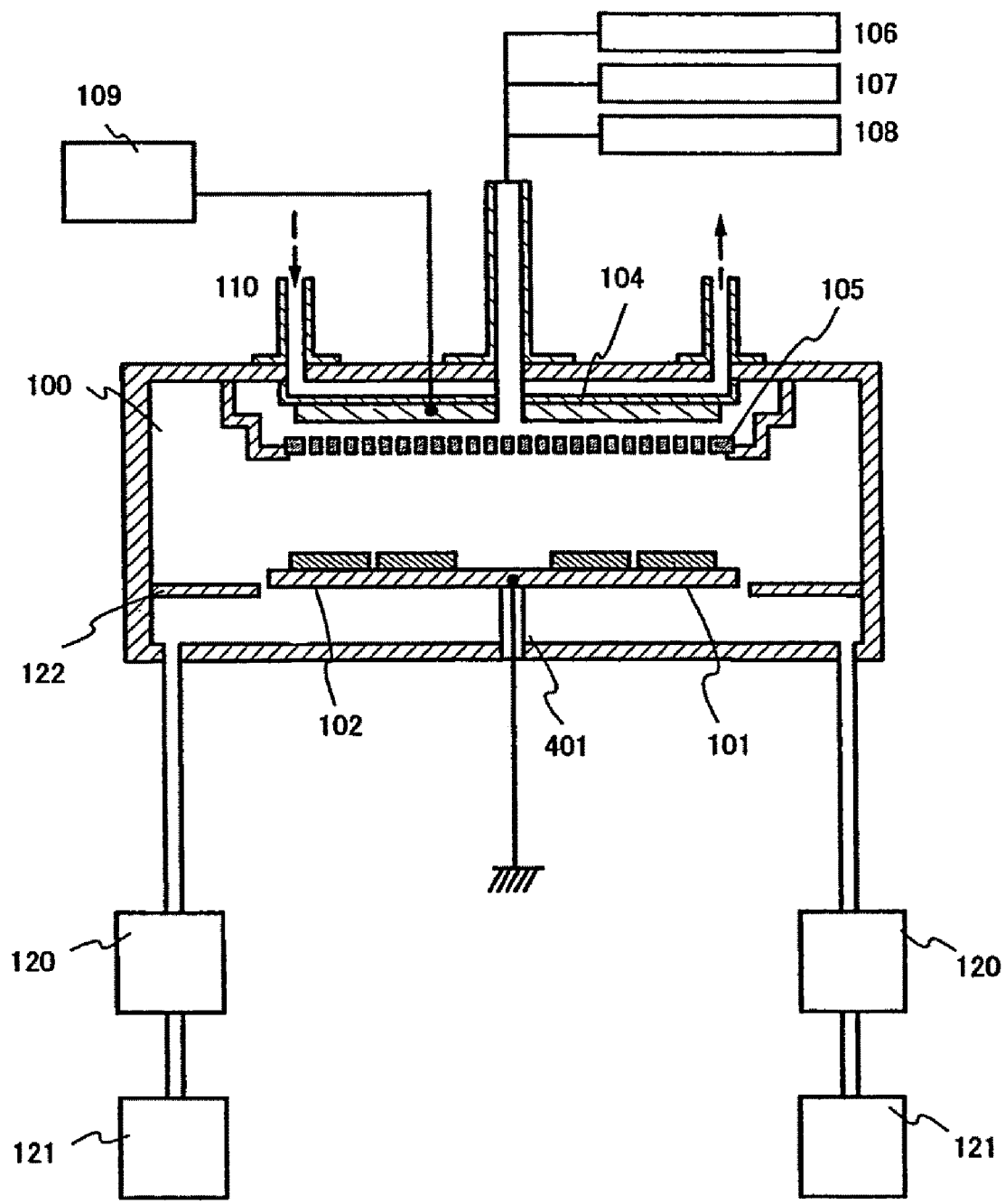
FIG. 3 is a diagram showing a CVD system for forming a composition including carbon nitride.

First, a case of depositing a composition including carbon nitride for an object to be coated in the shape with a planar surface will be described. FIG. 3 shows the same CVD system as that in FIG. 1, except the stage can be rotated. In other words, the stage 102 is provided in the deposition chamber 100 and plural objects to be coated 101 are fixed with a holder (not shown in the figure) on the stage 102. The stage 102 has a round shape, a rotating shaft 401 is provided and at the center to enable to rotate the fixed objects to be coated. In the rotating shaft 401, space is provided, and the stage 102 is grounded through the space.

When the plural objects are coated with a protective film while rotating, an uniform protective film can be formed, which is appropriate for mass production.

Besides, FIG. 4 shows a CVD system for coating a top surface and a side surface of a vertically fixed columnar object to be coated, which is different from FIG. 3.

Figure 4A:
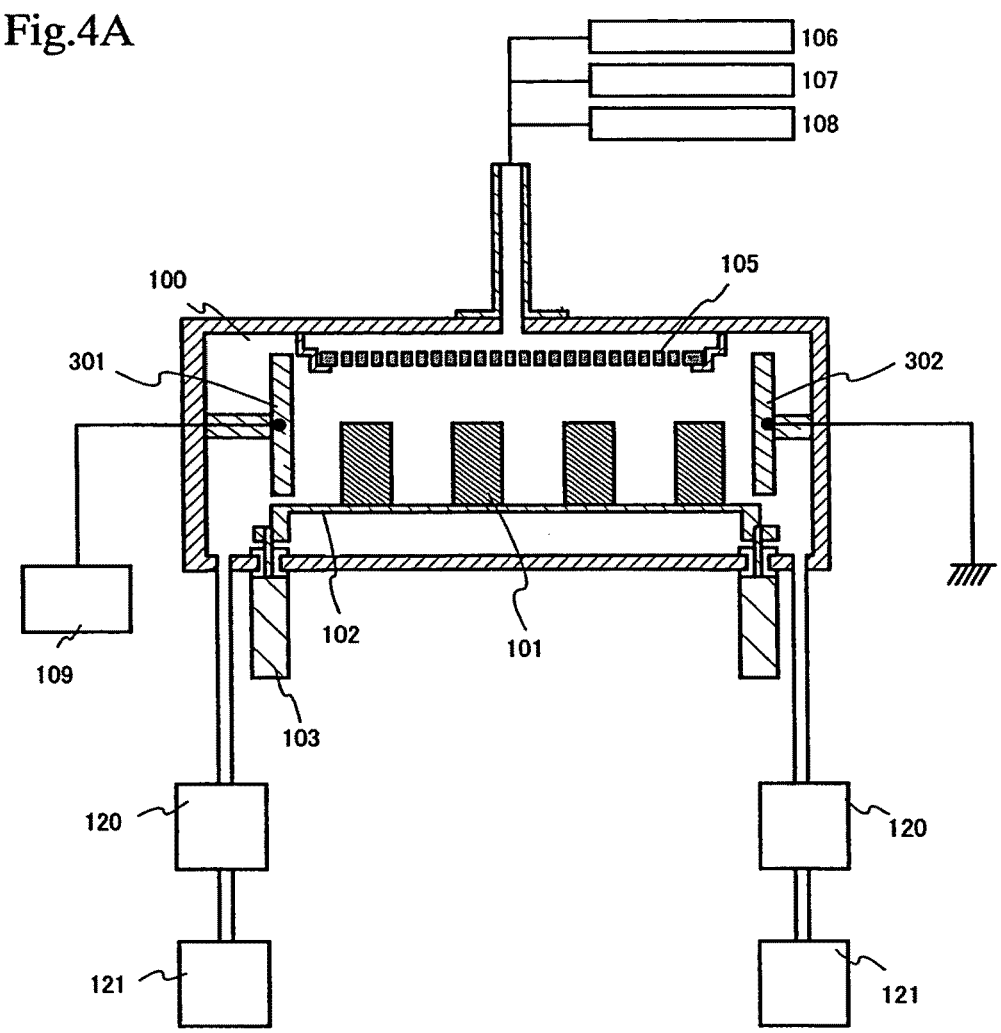
FIGS. 4A and 4B are diagrams showing a CVD system for forming a composition including carbon nitride.

As shown in a sectional view of FIG. 4A, a columnar object to be coated 101 are fixed with a holder (not shown in the figure) on the stage 102 to be vertical to the stage 102. In this case, a pair of electrode 301 and 302, to which a high-frequency wave is applied from a power source, are arranged to be vertical to the stage 102. Of, course, the pair of electrode 301 and 302 may be provided to be parallel to the stage 102. Further, a heating means or a cooling means may be provided in order to control temperatures of the pair of electrodes 301 and 302. One of the pair of electrodes 301 and 301 is connected to a high-frequency power source and the other is grounded. In FIG. 4, the electrode 301 is connected to the high-frequency power source 109 and the electrode 302 is grounded.

Figure 4B:
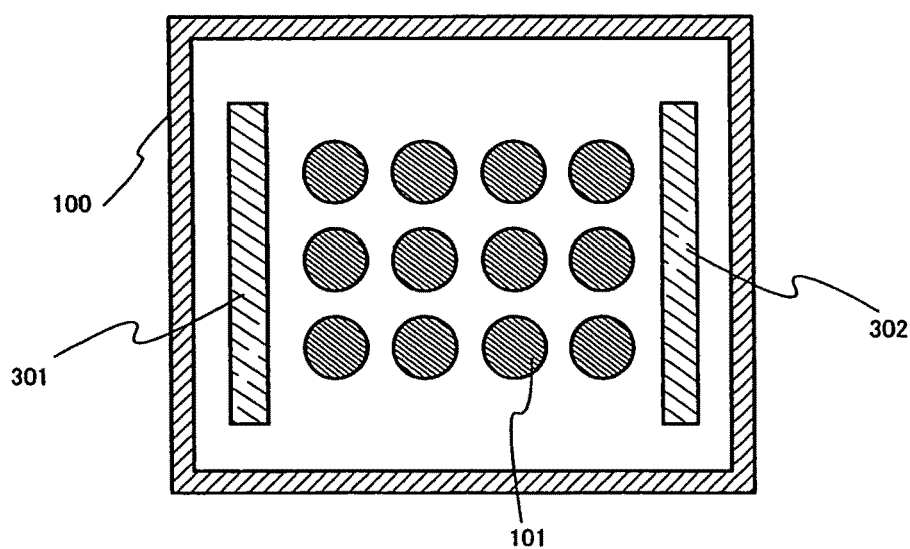

Besides, as shown in a top view of FIG. 4B, the pair of electrodes 301 and 302 are arranged to be vertical to the columnar object to be coated, and thereby reaction gas is spread all over.

In the case of the CVD system shown in FIG. 4, it is necessary to set a distance between the stage 102 and the shower head (an opening for supplying gas) 105 at a height of the object to be coated or more. However, the pair of electrodes 301 and 302 may have arrangement and shape devised in order to trap plasma. For example, the pair of electrodes 301 and 302 may be curved to have a shape of a half circle, or two or more electrodes may be provided to surround the objects to be coated. In addition, a rotating shaft may be provided to form a composition including carbon nitride while the stage is rotated.

As described above, various CVD systems may be used to manufacture a composition including carbon nitride, and thereby efficient mass production is possible.

Embodiment Mode 4

In the present embodiment mode, a method of manufacturing an active matrix substrate, which uses a composition including carbon nitride as an insulating film such as an interlayer insulating film, will be described with reference to FIGS. 6A to 6F. Although the active matrix substrate has a plurality of TFTs formed, a driver circuit including an n-channel TFT and a p-channel TFT and a pixel portion including an n-channel TFT will be described.

As shown in FIG. 6A, on a substrate with a insulating surface (hereinafter, denoted as an insulating substrate) 600, a base insulating film is formed of a single-layer film or a lamination-layer film of an insulating film such as a silicon oxide film, a silicon nitride film, or a silicon oxynitride film. The base insulating film is provided for preventing alkali metal included in the insulating substrate from diffusing into a semiconductor film to be formed later. As a first base insulating film 601a of the base insulating film, a silicon oxynitride film is formed to have a thickness from 10 to 20 nm (preferably, from 50 to 100 nm) by using plasma CVD with $SiH_4$, $NH_3$, $N_2O$, and $H_2$ as reactant gas. Here, silicon oxynitride film with a film thickness of 50 nm is formed. Then, as a second base insulating film 601b of the base insulating film, a silicon oxynitride film is formed to have a thickness from 50 to 200 nm (preferably, from 100 to 150 nm) by using plasma CVD with $SiH_4$ and $N_2O$ as reactant gas. Here, a silicon oxynitride film with a film thickness of 100 nm is formed. Of course, a composition including carbon nitride may be formed for the base insulating film.

Next, a first semiconductor film is formed on the base insulating film. As the first semiconductor film, a semiconductor film with an amorphous structure is formed by a method such as sputtering, LPCVD, or plasma CVD. In order to obtain a favorable crystalline structure, impurity elements such as oxygen and nitrogen in the first semiconductor layer preferably have a concentration reduced to $5 \times 10^{18}$ atomic/$cm^3$ or less. Therefore, it is preferable to use highly pure material gas, and further to use a CVD system for ultrahigh vacuum, which has an inside wall of a deposition chamber subjected to treatment for mirror finish (electrolytic polishing) and has an oil-free evacuation system. Further, it is preferable to form the base insulating film and the first semiconductor film continuously without exposing to air since the interface can be prevented from being contaminated. In the present embodiment mode, a semiconductor material containing silicon as its main constitute is used to form a first amorphous silicon film 602 with a thickness from 10 to 100 nm by plasma CVD.

After that, a material including a metal element typified by Ni (including states of a film and a liquid layer) 603 is formed on the first semiconductor film with any of spin coating, dip coating, plasma CVD, sputtering, and evaporation. In the present embodiment mode, nickel salt solution including Ni from 1 to 100 ppm by weight is applied by spin coating. In this case, it is preferable to use ozone containing solution to form a extremely thin oxide film in order to enhance wettability of the nickel salt solution to the first semiconductor film. Furthermore, it is preferable to remove the thin oxide film once and again form another thin oxide film with ozone containing solution. When the thin oxide film is formed in this way, the solution including the metal element (liquid layer) can be uniformly formed on the first semiconductor layer.

Next, heat treatment for crystallizing the first semiconductor film is performed to form a crystalline semiconductor film (a crystalline silicon film in the present embodiment mode). As a method for the heat treatment, furnace annealing using an electrothermal furnace, lamp rapid thermal annealing (LRTA) that is rapid thermal annealing using a lamp such as a halogen lump, a metal halide lamp, a xenon arc lamp, a carbon arc lamp, a high-pressure sodium lamp, or a high-pressure mercury lamp, and gas rapid thermal annealing (GRTA) that is rapid thermal annealing using heated gas may be employed.

Furthermore, in order to improve crystallinity of the first semiconductor film to repair defects remaining in crystal grains, a laser beam is preferably irradiated to the first semiconductor film. As the laser, continuous oscillation (CW: continuous wave) or pulse oscillation gas laser, or continuous oscillation or pulse oscillation solid laser is used. As the gas laser, excimer laser, Ar laser, and Kr laser can be given, and YAG laser, $YVO_4$ laser, YLF laser, $YAlO_3$ laser, glass laser, ruby laser, alexandrite laser, and Ti:sapphire laser can be given as the solid laser.

In the crystallization of the first semiconductor layer, it is preferable to use solid laser that is capable of continuous oscillation and use second to fourth harmonics of a fundamental wave in order to obtain a crystal in a large grain size. Typically, second harmonic (532 nm) or third harmonic (355 nm) of Nd:$YVO_4$ laser (fundamental wave: 1064 mm) is preferably used.

In the present embodiment mode, a laser beam emitted from continuous wave $YVO_4$ laser that outputs 10 W is converted into a harmonic with a non-linear optical element. Alternatively, a crystal of $YVO_4$ and a non-linear optical element may be put in a resonator to emit a harmonic. Then, a sectional shape of the laser beam at an irradiation surface is formed into a rectangular shape or an elliptic shape, and the shaped laser beam is irradiated to the first semiconductor film. In this case, an energy density approximately from 0.01 to 100 MW/$cm^2$ (preferably, 0.1 to 10 MW/$cm^2$) is required. The laser beam and the first semiconductor film are relatively moved at a speed approximately from 0.5 to 2000 cm/s to perform scanning.

In the thus formed crystalline semiconductor film, the metal element (Ni in the present embodiment mode) is remaining. Therefore, the metal element in the first semiconductor film, that is, the crystalline silicon film, has a concentration reduced by gettering to be described next.

First, an insulating film that serves as a barrier film is formed on the crystallized first semiconductor film. As the barrier film, an oxide film (chemical oxide) may be formed by performing treatment with ozone water or mixed solution of hydrogen peroxide water and one of sulfuric acid, hydrochloric acid, and nitric acid. Alternatively, an oxide film may be formed by plasma treatment in an oxidation atmosphere or irradiation of ultraviolet rays, or an insulating film including a silicon oxide film may be formed by any of plasma CVD, sputtering, and evaporation.

Then, a second semiconductor film that serves as a gettering site is formed on the barrier film to have a thickness from 25 to 250 nm. Since the second semiconductor film is removed later, a film with a low density is preferably formed.

After that, when heat treatment is performed, Ni that is the metal element in the first semiconductor film is diffused and moved into the second semiconductor film that serves as a gettering sink to perform a gettering process. For the heat treatment, any of furnace annealing, LRTA, and GRTA may be used. In the case of using furnace annealing, heat treatment for 0.5 to 12 hours is performed at 450 to 600° C. in a nitrogen atmosphere. In the case of using LRTA, a light source of a lamp for heating is turned on for 1 to 60 seconds, preferably for 30 to 60 seconds, which is repeated 1 to 10 times, preferably 2 to 6 times. The light source of the lamp has an emission intensity that can heat a semiconductor film instantaneously to a temperature from 600 to 1000° C., preferably from 700 to 750° C.

While heat treatment for gettering, crystallization of the first semiconductor film may be performed at the same time. In other words, crystallization of the first semiconductor film and gettering can be both attained by heating once, and thereby the number of processed can be reduced.

After that, the second semiconductor film is removed by wet etching, which may be performed with alkali solution such as solution including hydrazine or tetraethyl ammonium hydroxide (TMAH). In this case, the barrier film functions as an etching stopper. The barrier film may be removed with hydrofluoric acid after etching the second semiconductor film.

The crystallized first semiconductor film thus formed, that is, the crystalline semiconductor film has a crystal in the shape of an elongated bar or an elongated flat crystal due to action of the metal element, and the crystal is grown with a specific orientation when the crystal is seen in broad perspective.

Then, in order to control threshold voltage that is a semiconductor characteristic, the crystalline semiconductor film is preferably doped with boron. (referred to as channel doping). After that, as shown in FIG. 6B, the crystalline semiconductor film is subjected to patterning to have a desired shape for an active layer, and thereby island-shaped crystalline semiconductor films 605a to 605d are obtained.

Next, the active layer has a surface cleaned with etchant including hydrofluoric acid, and a gate insulating film 606 for covering the active layer is formed. Plasma CVD or sputtering is used to form the insulating film 606 of an insulating film including silicon, which has a thickness from 40 to 150 nm. In the present embodiment mode, plasma CVD is used to form a silicon oxynitride film (composition ratio: Si=32%; O=59%; N=7%; and H=2%) with a thickness of 115 nm. Of course, the gate insulating film is not limited to the silicon oxynitride film, and a composition including carbon nitride according to the present invention may be used. When the base insulating film and the gate insulating film are formed of the same material by the same method, the coefficient of thermal expansion of the gate insulating film becomes equal to that of the base insulating film, and peeling from an interface can be prevented when a semiconductor film is expanded due to heat treatment such as activation.

Next, as shown in FIG. 6C, a first conductive film 608a with a film thickness from 20 to 100 nm and a second conductive film 608b with a film thickness from 100 to 400 nm are laminated on the gate insulating film to form a gate electrode 608 (first wiring). In the present embodiment mode, a tantalum nitride (TaN) film with a film thickness of 50 nm and a tungsten (W) film with a film thickness of 370 nm are sequentially laminated on the gate insulating film 606 to form the gate electrode.

The first and second conductive layers may be formed of an element selected from Ta, W, Ti, Mo, Al, and Cu, or an alloy material or a compound material containing the element as its main constitute. Alternatively, as the first and second conductive layer, a semiconductor film typified by a polycrystalline silicon film doped with an impurity element such as phosphorus or an AgPdCu alloy may be used. The structure of the gate electrode is not limited to the two-layer structure. For example, a tungsten film with a film thickness of 50 nm, an alloy (Al—Si) film of aluminum and silicon with a film thickness of 500 nm, and a titanium nitride with a film thickness of 30 nm may be sequentially laminated, that is, a three-layer structure may be employed. In the case of the three-layer structure, a tungsten nitride film may be used in place of the tungsten film as the first conductive film, an alloy (Al—Ti) film of aluminum and titanium may be used in place of the alloy (Al—Si) film of aluminum and silicon as the second conductive layer, and a titanium film may be used in place of the titanium nitride film as the third conductive film. Alternatively, a single-layer structure may be employed. In the present embodiment mode, the TaN film and the W film are used as the first conductive layer and the second conductive layer, respectively.

After that, patterning is performed in accordance with the procedures hereinafter prescribed to form respective gate electrodes and respective wirings. When ICP (Inductivity Coupled Plasma) etching is used and conditions for etching (such as electric energy applied to a coiled electrode, electric power applied to an electrode at the substrate side, and a temperature of the electrode at the substrate side) are appropriately controlled, the TaN film and the W film can be etched into a desirable tapered shape. As etching gas, chlorine-based gas typified by $Cl_2$, $BCl_3$, $SiCl_4$, and $CCl_4$, fluorine-based gas typified by $CF_4$, $SF_6$, and $NF_3$, and $O_2$ can be appropriately used.

First, a mask of resist in a desired shape (not shown in the figure) is formed on the W film. As conditions for first etching, $CF_4$, $Cl_2$, and $O_2$ are used as etching gas to have gas flow rates set at 25/25/10 (sccm) respectively, RF (13.56 MHz) power of 700 W is applied to a coiled electrode with a pressure of 1 Pa, and RF (13.56 MHz) power of 150 W is applied to the substrate side (sample stage) to apply a substantially negative self-bias voltage. Under the conditions, only the W film is etched to form a tapered shape that has an edge with angle from 15° to 45°.

After that, second etching is performed without removing the mask of resist. As conditions for the second etching, $CF_4$ and $Cl_2$ are used as etching gas to have gas flow rates set at 30/30 (sccm) respectively, RF (13.56 MHz) power of 500 W is applied to a coiled electrode with a pressure of 1 Pa, and RF (13.56 MHz) power of 20 W is applied also to the substrate side (sample stage) to apply a substantially negative self-bias voltage. Under the conductions for the second etching, the TaN film as the first conductive film and the W film as the second conductive film are etched at the same level.

Next, without removing the mask of resist, first doping process for doping the semiconductor films with an impurity element that imparts conductivity is performed with the gate electrode as a mask. The first doping process may be performed by ion doping or ion implantation. As an impurity element that imparts n-type conductivity, phosphorus (P) or arsenic (As) is typically used. According to the first doping process, a first impurity region 609 is formed in self-aligning.

The first impurity region 609 is doped with the impurity element that imparts n-type conductivity at a concentration from $1\times10^{20}$ to $1\times10^{21}$/cm$^3$.

Next, third etching is performed without removing the mask of resist. As conditions for the third etching, CF$_4$ and Cl$_2$ are used as etching gas to have gas flow rates set at 30/30 (sccm) respectively, RF (13.56 MHz) power of 500 W is applied to a coiled electrode with a pressure of 1 Pa, and RF (13.56 MHz) power of 20 W is applied also to the substrate side (sample stage) to apply a substantially negative self-bias voltage.

After that, fourth etching is performed without removing the mask of resist. As conditions for the fourth etching, CF$_4$, Cl$_2$, and O$_2$ are used as etching gas to have gas flow rates set at 20/20/20 (sccm) respectively, RF (13.56 MHz) power of 500 W is applied to a coiled electrode with a pressure of 1 Pa, and RF (13.56 MHz) power of 20 W is applied also to the substrate side (sample stage) to apply a substantially negative self-bias voltage. According to the third etching and the fourth etching, the W film and the TaN film are subjected to anisotropic etching. Oxygen is included in the etching gas to make a difference in etching rate between the W film and the TaN film and make the etching rate of the W film faster than the etching rate of the TaN film. Besides, not shown in the figure, a portion of the gate insulating film, which is not covered with the first conductive layer, is etched to become thinner. At this stage, the gate electrode 608 that has the first conductive layer 608a of the TaN film as the lower layer and the second conductive layer 608b of the W film as the upper layer are completed.

Next, after removing the mask of resist, another mask of resist is newly formed on the n-channel TFTs to perform a second doping process. According to the second doping process, the semiconductor layer for forming the p-channel TFT is doped with an impurity element (such as boron) that imparts p-type conductivity to form a second impurity region 610, which is doped with the impurity element that imparts p-type conductivity at a concentration from $1\times10^{20}$ to $1\times10^{21}$/cm$^3$. Although the second impurity region is doped with phosphorus (P) in the previous doping process, the second impurity region 610 is doped with the impurity element that imparts p-type conductivity at a concentration that is 1.5 to 3 times as high as that of phosphorus to have p-type conductivity.

In the present embodiment mode, a lightly doped drain region (LDD region) and a lightly doped drain region that overlaps the gate electrode 608 (GOLD region) may be appropriately formed.

According to the processes described above, the impurity region that has n-type or p-type conductivity is formed in each of the semiconductor films. After forming the impurity region, heat treatment, irradiation of intense light, or irradiation of laser light is conducted in order to activate the impurity element. As well as the activation, plasma damage to the gate insulating film and an interface between the gate insulating film and the semiconductor film can be recovered. In particular, light from excimer laser is irradiated from a front-face side or a rear-face side in an atmosphere at an ambient temperature to 300° C. to activate the impurity element. Alternatively, second harmonic of YAG laser may be irradiated to activate the impurity region. YAG laser is a preferable means for activation since little maintenance is required.

Next, as shown in FIG. 6D, a composition including carbon nitride 612, which serves as a first interlayer insulating film, is deposited by plasma CVD at a reaction temperature from 20° C. to 30° C. to have a thickness of 100 nm. Since the composition including carbon nitride includes a lot of hydrogen and produces high stress relaxation, coverage to a step is favorable in the deposition. After that, a dangling bond in the semiconductor film can be terminated when hydrogen annealing with a vertical annealing furnace or hydrogen plasma treatment is conducted. On this occasion, advantageous effects of sintering metal and recovering plasma damage due to etching can be expected.

After that, as shown in FIG. 6E, a second interlayer insulating film 613 comprising an inorganic insulating material including silicon or an organic insulating material is formed on the first interlayer insulating film. As the organic insulating material, positive photosensitive organic resin or negative photosensitive organic resin can be used. In the case of using the photosensitive organic resin, an opening with curvature can be formed when the photosensitive organic resin is etched with exposure treatment in a photolithography process. However, in the case of using the positive photosensitive organic resin for the second interlayer insulating film, decoloration treatment for the photosensitive organic resin is required after etching since the positive photosensitive organic resin is colored with a blown color. In the case of forming the second interlayer insulating film with the use of the photosensitive organic resin, an insulating film including nitrogen is preferable formed on the second interlayer insulating film in order to prevent moisture from being released from the interlayer insulating film, and a composition including carbon nitride may be formed. In the present embodiment mode, plasma CVD is used and a silicon oxide film is formed to have a thickness of 1 μm as the second interlayer insulating film.

Next, the second interlayer insulating film 613, the first interlayer insulating film 612, and the gate insulating film 606 are sequentially etched to form an opening. In this case, dry etching and wet etching have no preference, and the both can be employed. In the present embodiment mode, an opening (contact) with a smooth taper (angle) is formed by dry etching. After forming the opening, a metal element is formed on the second interlayer insulating film and in the opening, and the metal element is subjected to etching to form source and drain electrodes 615 and a wiring (second wiring). As the metal film, a film including an element selected from aluminum (Al), titanium (Ti), molybdenum (Mo), tungsten (W), and silicon (Si) or an alloy film including the metal element may be used.

In the present embodiment mode, after laminating a titanium film (Ti), a silicon-aluminum alloy film (Ai-Si), and a titanium film (Ti) to have thicknesses of 100 nm, 350 μm, and 100 nm, respectively, patterning and etching into a desired shape is performed to form the source and drain electrodes and the wiring. After that, an electrode (an electrode that serves as an anode or a cathode of a light emitting element) 616 is formed. As the electrode, a transparent conductive film such as ITO or SnO$_2$ can be used. In the present embodiment mode, ITO is deposited to become a thickness of 110 nm, and etching into a desired shape is conducted to form the electrode 616.

According to the processes described above, the active matrix substrate that has a composition including carbon nitride according to the present invention is completed. The composition including carbon nitride may be applied to any of insulating films such as a base insulating film, an interlayer insulating film, a protective film, and a passivation film, which are formed for the active matrix substrate. In the case of using the composition including carbon nitride according to the present invention for an interlayer insulating film, in particular, the interlayer insulating film is made to include more nitrogen and have a lower dielectric constant, and it is expected that delay in action of a circuit can be prevented.

In the present embodiment mode, an example of a top-gate thin film transistor with a gate electrode provided over a semiconductor film is described. However, the present invention can also be applied to a bottom-gate thin film transistor with a gate electrode below a semiconductor film.

The case of crystallizing a semiconductor film to form a polycrystalline semiconductor film, which is used for a portion such as a channel formation region of a thin film transistor, is described. However, needless to say, the composition including carbon nitride can be used also in the case of forming a polycrystalline semiconductor film over a quartz substrate. In addition, the composition including carbon nitride can be used also for a film such as an interlayer insulating film of a thin film transistor that uses an amorphous semiconductor film.

Furthermore, since a composition including carbon nitride according to the present invention is formed preferably at 20° C. to 30° C., the composition can be used for a film such as an interlayer insulating film of a thin film transistor formed over a plastic (resin) substrate including resin such as polycarbonate (PC), polyarylate (PAR), poly ether sulfone (PES) or polytetra-fluoroethylene (PTFE). When a thin film transistor is formed over the plastic substrate, a device that has the thin film transistor becomes lighter and becomes hard to be broken. Other than the plastic substrate, a glass substrate or a ceramics substrate that has a thickness thinned to become more flexible may be used. Hereinafter, a thin and flexible substrate such as the plastic substrate or the ceramics substrate is denoted also as a film substrate.

Embodiment Mode 5

In the present embodiment mode, a liquid crystal display device that has an active matrix substrate formed as described in Embodiment Mode 4 will be described with reference to FIGS. 7A and 7B.

Figure 7A:
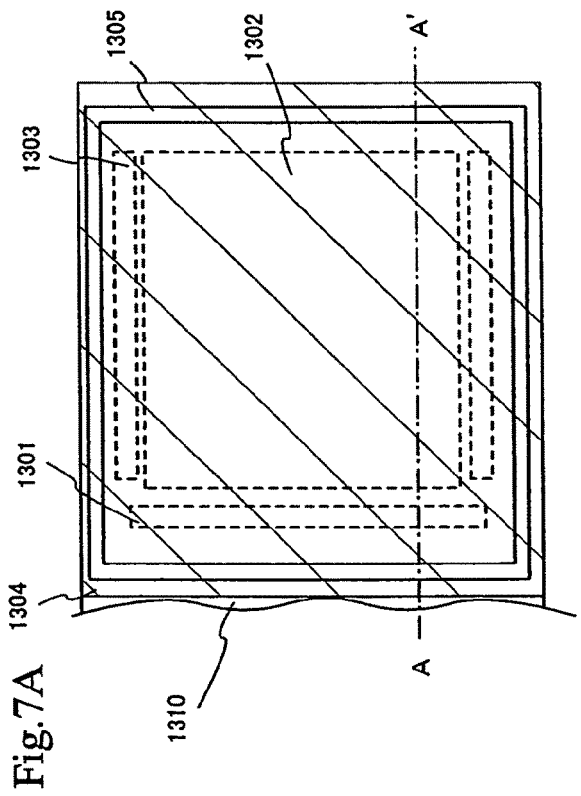
FIGS. 7A and 7B are diagrams showing a liquid crystal display device provided with a thin film transistor according to the present invention.

FIG. 7A shows a top view of a liquid crystal device, a signal line driver circuit 1301, a scan line driver circuit 1303, and a pixel portion 1302 are provided a signal over a first insulating substrate 1310.

Figure 7B:
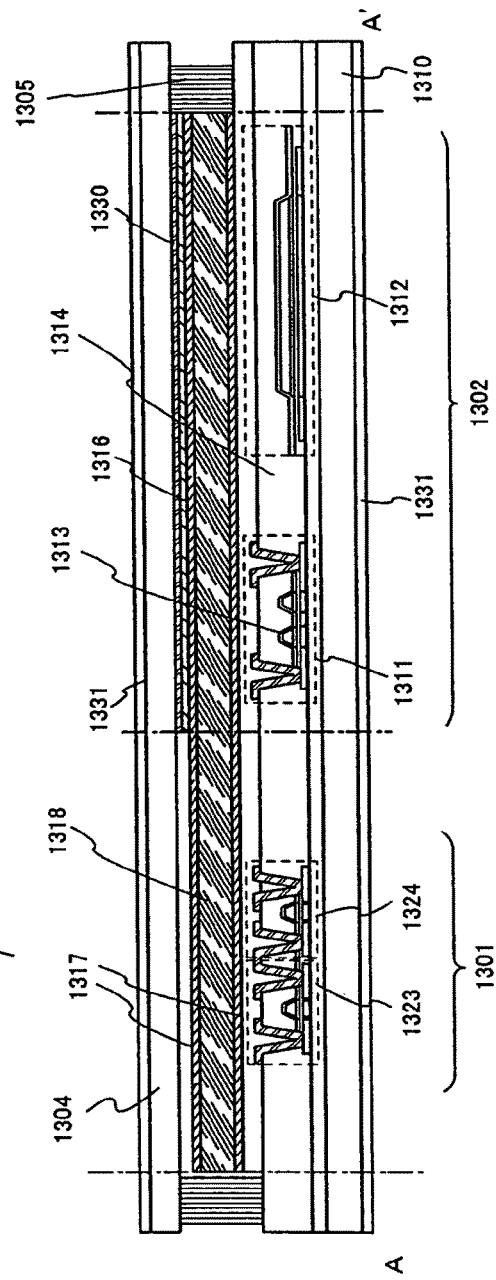

FIG. 7B shows a sectional view of the liquid crystal display device along A-A', and the signal line driver circuit 1301 that has a CMOS circuit of an n-channel TFT 1323 and a p-channel TFT 1324 is provided over the first insulating substrate 1310. For a thin film transistor (TFT) for forming the signal line driver circuit and the scan line driver circuit, a CMOS circuit, a PMOS circuit, and an NMOS circuit may be used. In the present embodiment mode, an example of a built-in driver type that has a signal line driver circuit and a scan line driver circuit formed over a substrate is described. However, it is not always necessary to form the signal driver circuit and the scan line driver circuit over the substrate, which may be formed outside the substrate.

In addition, FIG. 7B shows the pixel portion 1302 that has a switching TFT 1311, a storage capacitor 1312, and a second interlayer insulating film 1314 covering the switching TFT 1311 and the storage capacitor 1312 with an opening in a predetermined position. The switching TFT 1311 has a semiconductor film electrically connected to a pixel electrode (not in the figure).

A first interlayer insulating film 1313 (partially shown in the figure) that comprises a composition including carbon nitride according to the present invention is provided to cover a gate electrode and a semiconductor layer. A second interlayer insulating film 1314 is provided on the first interlayer insulating film 1313 and an orientation film 1317 subjected to rubbing treatment is provided on the second interlayer insulating film 1314.

As an opposing substrate, a second insulating substrate 1304 is prepared. The second insulating substrate 1304 has a color filter 1330 for RGB, an opposed electrode 1316, and the orientation film 1317 subjected to rubbing treatment.

In addition, the first and second insulating substrates 1310 and 1304 respectively have polarization plates 1331, and are bonded with a sealing agent 1305. As the sealing agent 1305, thermosetting resin, ultraviolet cure resin, or hybrid resin of thermosetting resin and ultraviolet cure resin may be used.

The liquid crystal display device has a liquid-crystal material 1318 between the first and second insulating substrates. By vacuum injection or dropping, the liquid-crystal material 1318 is injected between the first and second insulating substrates.

Not shown in the figure, a spacer for keeping constant between the first and second insulating substrates is appropriately provided. As the spacer, a spherical spacer may be scattered or a columnar spacer may be arranged.

Besides, an anisotropic conductive resin (ACF: anisotropic conductive film/ACP: anisotropic conductive paste) is used to connect wiring of the liquid crystal display device to a flexible printed substrate (FPC: flexible printed circuit), and the wiring is given a video signal or a clock signal. In connecting FPC, it is necessary to be careful to avoid crack initiation.

In this way, it is possible to complete a liquid crystal display device that has a TFT including a composition including carbon nitride according to the present invention. The composition including carbon nitride according to the present invention may be used for any insulating film of the TFT.

In the present embodiment mode, a film substrate can be used as the insulating substrate. In this case, it is possible to provide a thinner and lighter liquid crystal display device.

Embodiment Mode 6

In the present embodiment mode, an example of a display device that has a light-emitting element, which has a TFF manufactured over a film substrate, will be described with reference to FIGS. 8A and 8B, in which a composition including carbon nitride according to the present invention for a protective film on a cathode or an anode.

FIG. 8A shows a top view of a display device that has a light-emitting element, and a signal line driver circuit 1201, a scan line driver circuit 1203, and a pixel portion 1202 are provided over a first film substrate 1210.

FIG. 8B is a sectional view of the display device that has the light-emitting element along A-A', and the signal line driver circuit that has a CMOS circuit of an n-channel TFT 1223 and a p-channel TFT 1224 is provided over the first film substrate 1210. For a TFT for forming the signal line driver circuit and the scan line driver circuit, a CMOS circuit, a PMOS circuit, and an NMOS circuit may be used. In the present embodiment mode, an example of a built-in driver type that has a signal line driver circuit and a scan line driver circuit formed over a substrate is described. However, it is not always necessary to form the signal driver circuit and the scan line driver circuit over the substrate, which may be formed outside the substrate.

In addition, FIG. 8B shows the pixel portion 1202 that has a switching TFT 1211, a current control TFT 1212, an insulating film 1214 covering the switching TFT 1211 and the current control TFT 1212 with an opening in a predetermined position, a light-emitting element 1218, and a protective film 1217 provided for preventing degradation of the light-emitting element due to moisture and oxygen. The light-emitting element 1218 has a first electrode 1213 connected to one of wirings of the current control TFT 1212, a light-emitting layer that has an organic material (hereinafter, denoted as an organic light-emitting layer) 1215 provided on the first electrode 1213, and a second electrode 1216 provided on the organic light-emitting layer 1215, and a protective film 1217 provided for preventing degradation of the light-emitting element due to moisture and oxygen. The light-emitting layer of the light-emitting element may have an inorganic material included or may have a mixed material of an organic material and an inorganic material.

In the present embodiment mode, a composition including carbon nitride according to the present invention is used for the protective film 1217. In other words, for the protective film formed after forming the organic light-emitting layer with low heat resistance, the composition including carbon nitride according to the present invention is formed preferably at 20° C. to 30° C. to prevent degradation due to heat. In the case of forming a protective film for a semiconductor device formed over a film substrate as the present embodiment mode, the use of a composition including carbon nitride according to the present invention makes it possible to prevent deformation of the film substrate.

Since the first electrode 1213 is connected to the wiring of the current control TFT 1212, the first electrode 1213 has at least a basal plane formed of a material that can have ohmic contact with a drain region of a semiconductor film of the current control TFT 1212, and a material with a large work function is preferably used to form a surface in contact with the organic light-emitting layer. When a three-layer structure of a titanium nitride film, a film containing aluminum as its main constituent, and a titanium nitride film is employed, for example, it is possible for the first electrode 1213 to function as a wiring with low resistance and favorable ohmic contact. Alternatively, the first electrode 1213 may have a single layer of a titanium nitride film or a lamination layer of three layers or more. Besides, when a transparent conductive film is used as the first electrode 1213, it is possible to manufacture a display device that has a both-emission type light-emitting element.

The insulating film 1214 may be formed of an organic resin film or an insulating film including silicon. Here, a positive photosensitive acrylic resin film is used for the insulating film 1214.

In order for the organic light-emitting layer and the second electrode, which are to be formed later, to have favorable coverage for a step, the insulating film 1214 preferably has an upper end portion or a lower end portion formed to have a curved surface with curvature. In the case of using a positive photosensitive acrylic resin as a material of the insulating film 1214, for example, only the upper edge portion of the insulating film 1214 preferably has a curved surface with a curvature radius (0.2 µm to 3 µm). For the insulating film 1214, negative photosensitive resin that becomes insoluble in etchant by light and positive photosensitive resin that becomes soluble in etchant by light can both be used.

Besides, the insulating film 1214 may be covered with an insulating film including nitrogen. For the insulating film including nitrogen, it is possible to use a composition including carbon nitride according to the present invention, or to use an insulating film containing silicon nitride or silicon oxynitride as its main constituent such as an aluminum nitride film, an aluminum oxynitride film, or a silicon nitride film, which is obtained with sputtering (DC system/RF system) or a deposition system that uses remote plasma, or a thin film containing carbon as its main constituent.

On the first electrode 1213, the organic light-emitting layer 1215 for obtaining emission of RGB is selectively formed with evaporation that uses an evaporation mask or ink jet. The second electrode 1216 is formed on the organic light-emitting layer 1215.

In the case that the light-emitting element 1218 is a white light-emitting element, it is necessary to provide a color filter comprising a coloring layer and a BM (black matrix)

The second electrode 1216 is connected to a connection wiring 1208 in a connection region in an opening (contact) of the insulating film 1214. The connection wiring 1208 is connected to a flexible printed substrate (FPC) through an anisotropic conductive resin (ACF), and given a video signal and a clock signal from the FPC 1209 that serves as an external input terminal. Although only the FPC is shown here, a printed wiring substrate (PWB: printed wiring board) may be mounted with the FPC.

When the ACF is bonded while applying pressure or heating, it is necessary to be careful to avoid crack initiation due to flexibility of the film substrate or softening during heating. For example, a rigid substrate may be provided as a support in the connection region.

In addition, a sealing material 1205 is marginally provided over the edge of the first film substrate to bond the first film substrate and a second film substrate 1204 for sealing. As the sealing material 1205, epoxy resin is preferably used.

In the present embodiment mode, as the second film substrate 1204, a plastic substrate including a material such as FRP (Fiberglass-Reinforced Plastics), PVF (poly vinyl fluoride), mylar, polyester, or acrylic can be used in addition to a glass substrate and a quartz substrate.

Not shown in the figure, in order to avoid penetration of moisture and oxygen, the film substrate is preferably covered with a barrier film including an organic material such as poly vinyl alcohol or ethylene-vinyl alcohol copolymer (EVOH), an inorganic material such as polysilazane, aluminum oxide, silicon oxide, or silicon nitride, or a lamination film thereof.

In addition, in order to protect from chemicals in a manufacturing process, the film substrate has a protective film provided. As the protective film, ultraviolet cure resin or thermosetting resin can be used.

As described above, the display device that has the light-emitting element, which has the composition including carbon nitride provided over the film substrate, is completed.

Embodiment Mode 7

An active matrix substrate that has a composition including carbon nitride according to the present invention can be applied to various electronic devices. The electronic devices include a personal digital assistance (a mobile phone, a mobile computer, a portable game machine, or an electronic book), a video camera, a digital camera, a goggle type display, a display, and a navigation system can be given. FIGS. 9A to 9E show examples of the electronic devices.

Figure 9A:
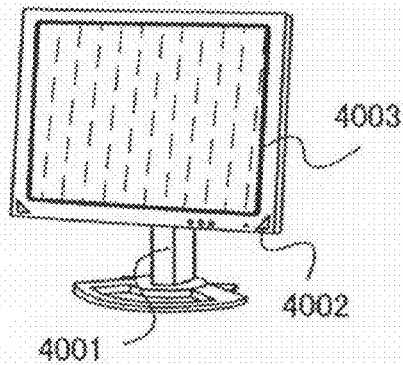
FIGS. 9A to 9E are diagrams showing examples of electronic devices according to the present invention.

FIG. 9A shows a display device, which includes a frame body 4001, voice output portion 4002, and a display portion 4003. It is possible to use an active matrix substrate that has a composition including carbon nitride according to the present invention to complete the display portion 4003 that uses a light-emitting element or a liquid crystal material. The display device includes all display devices for displaying information, such as a personal computer, a receiver of TV broadcasting and an advertising display.

Figure 9B:
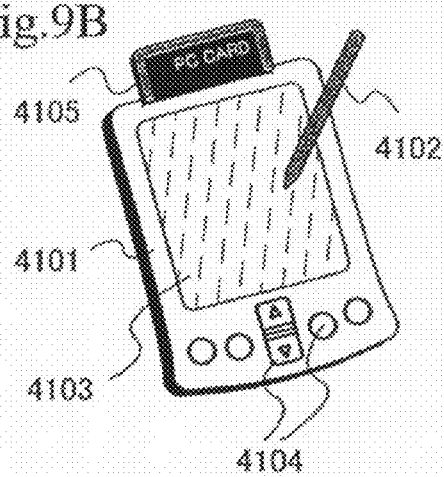

FIG. 9B show a mobile computer, which includes a main body 4101, a stylus 4102, a display portion 4103, an operation button 4104, and an external interface 4105. It is possible to use an active matrix substrate that has a composition including carbon nitride according to the present invention to complete the display portion 4103 that uses a light-emitting element or a liquid crystal material.

Figure 9C:
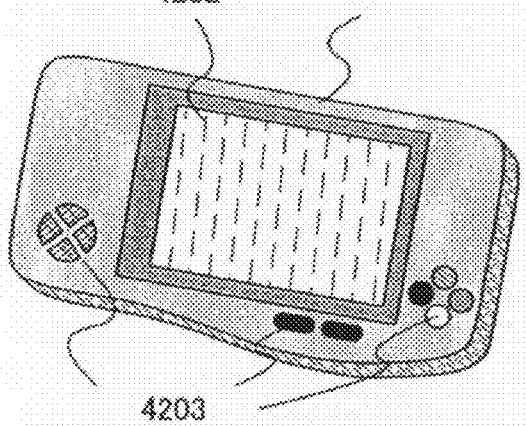

FIG. 9C shows a game machine, which includes a main body 4201, a display portion 4202, and an operation button 4203. It is possible to use an active matrix substrate that has a composition including carbon nitride according to the present invention to complete the display portion 4202 that uses a light-emitting element or a liquid crystal material.

Figure 9D:
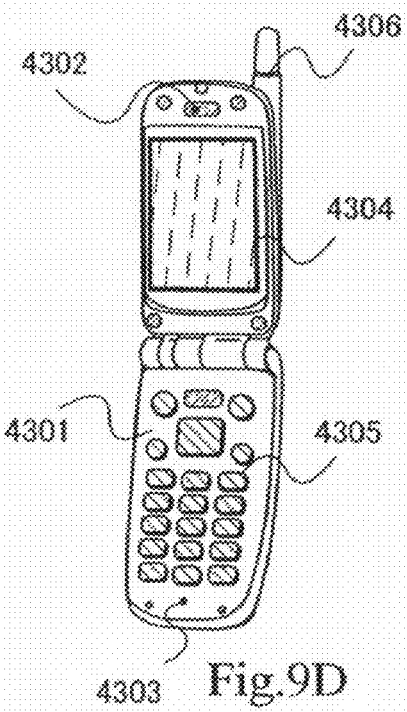

FIG. 9D shows a mobile phone, which includes a main body 4301, a voice output portion 4302, a voice input portion 4303, a display portion 4304, an operation switch 4305, and an antenna 4306. It is possible to use an active matrix substrate that has a composition including carbon nitride according to the present invention to complete the display portion 4304 that uses a light-emitting element or a liquid crystal material.

Figure 9E:
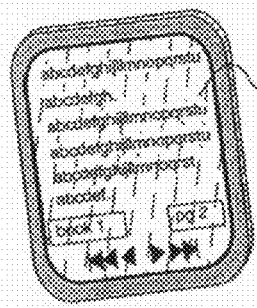

FIG. 9E shows an electronic book, which includes a display portion 4401. It is possible to use an active matrix substrate that has a composition including carbon nitride according to the present invention to complete the display portion 4401 that uses a light-emitting element or a liquid crystal material.

As described above, the present invention can be fairly widely applied to electronic devices in various fields. Particularly, the present invention is useful for the electronic devices shown in FIGS. 9A to 9E in the case of becoming thinner and lighter with the use of a flexible substrate as an insulating substrate of an active matrix substrate.

EMBODIMENTS

Embodiment 1

The present embodiment shows results of component analysis of compositions including carbon nitride, which are formed by plasma CVD with the use of $C_2H_2/N_2$ gas, $C_2H_4/N_2$ gas, and $C_2H_4/NH_3$ gas.

Table 1 shows results of component analysis (NRA/HFS) of compositions including carbon nitride according to the present invention, samples A to C, which are manufactured under different conditions. The samples A and B have a film thickness of approximately 100 nm and the sample C has a film thickness of approximately 10 nm.

[Table 1]

The present embodiment proves that the ratio of hydrogen concentration in the composition including carbon nitride (hydrogen ratio) ranges approximately from 35 to 40 atomic % (strictly, from 35.8 to 40.4 atomic %). Since a SiN film generally has a hydrogen ratio of approximately 25 atomic %, it is understood that the composition including carbon nitride according to the present invention has a considerably high hydrogen ratio. In addition, it is proven that the ratio of carbon concentration in the composition including carbon nitride (carbon ratio) ranges approximately from 40 to 50 atomic % (strictly, from 21.4 atomic %, which may have an excess measurement error, to 50.8 atomic %) and the ratio of nitrogen concentration in the composition including carbon nitride (nitrogen ratio) ranges approximately from 10 to 20 atomic % (strictly, from 13.4 atomic % to 42.7 atomic % which may have an excess measurement error) with the result that the sample A has a tensile stress of $1.5 \times 10^9$ $dyne/cm^2$.

Figure 10:
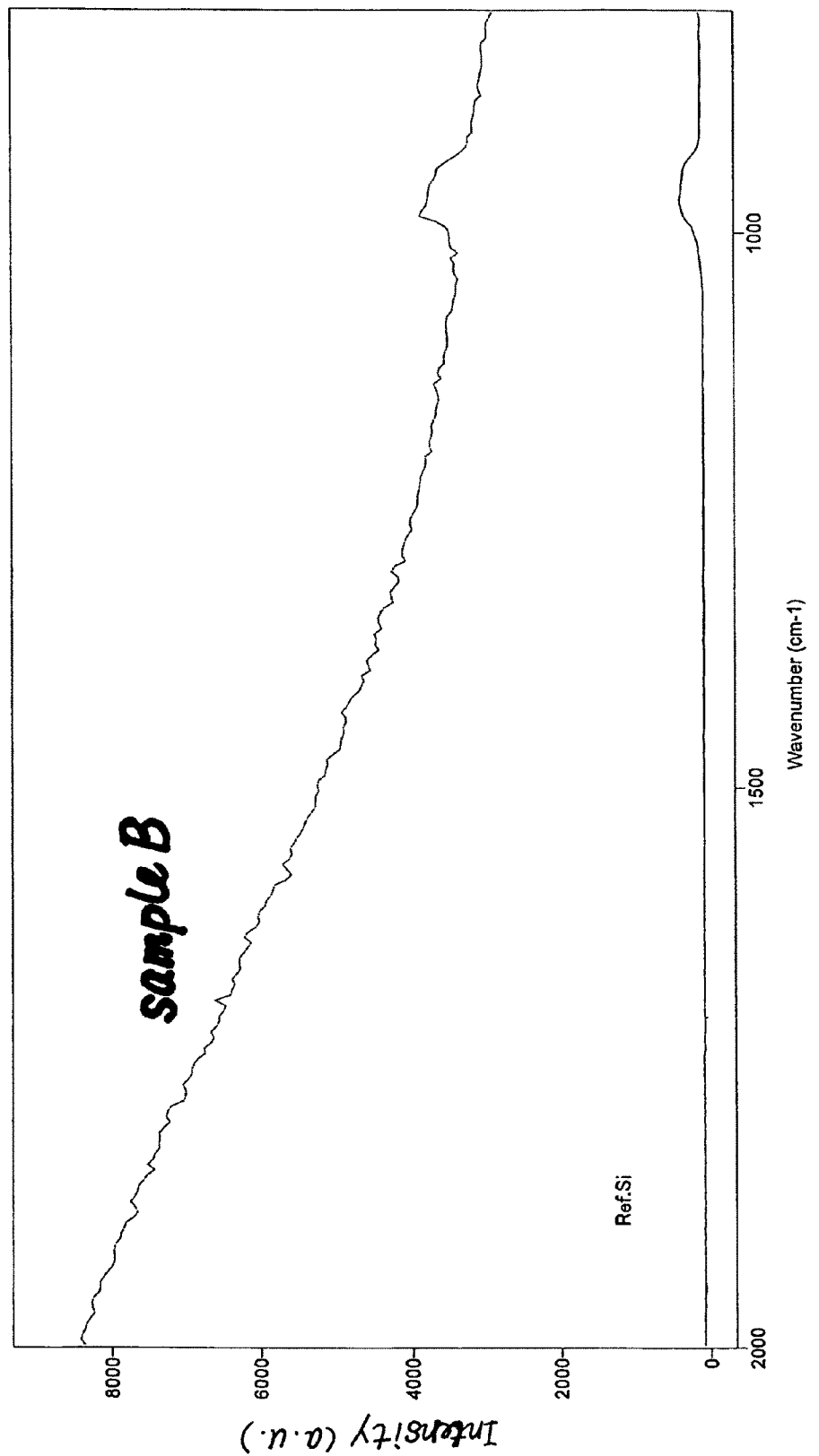
FIG. 10 is a graph showing a measurement result by raman spectroscopy of a composition including carbon nitride according to the present invention.

Besides, FIG. 10 shows a measurement result of raman spectrum with excitation light of 514.5 nm for the sample B formed on a silicon wafer. In FIG. 10, no peak due to a crystalline structure is identified while fluorescence is identified. There is a peak at a wavenumber approximately from 900 to 100 $cm^{-1}$ because of the silicon wafer (refer to Ref. Si). Consequently, It is found that the sample B of the composition including carbon nitride is amorphous. In the case of common DLC, a peak can be observed at a wavenumber of approximately 1600 $cm^{-1}$. In addition, since fluorescence is observed in changing a network structure to a linear structure, it is believed that a network structure is reduced in the sample B of the composition including carbon nitride.

Figure 11:
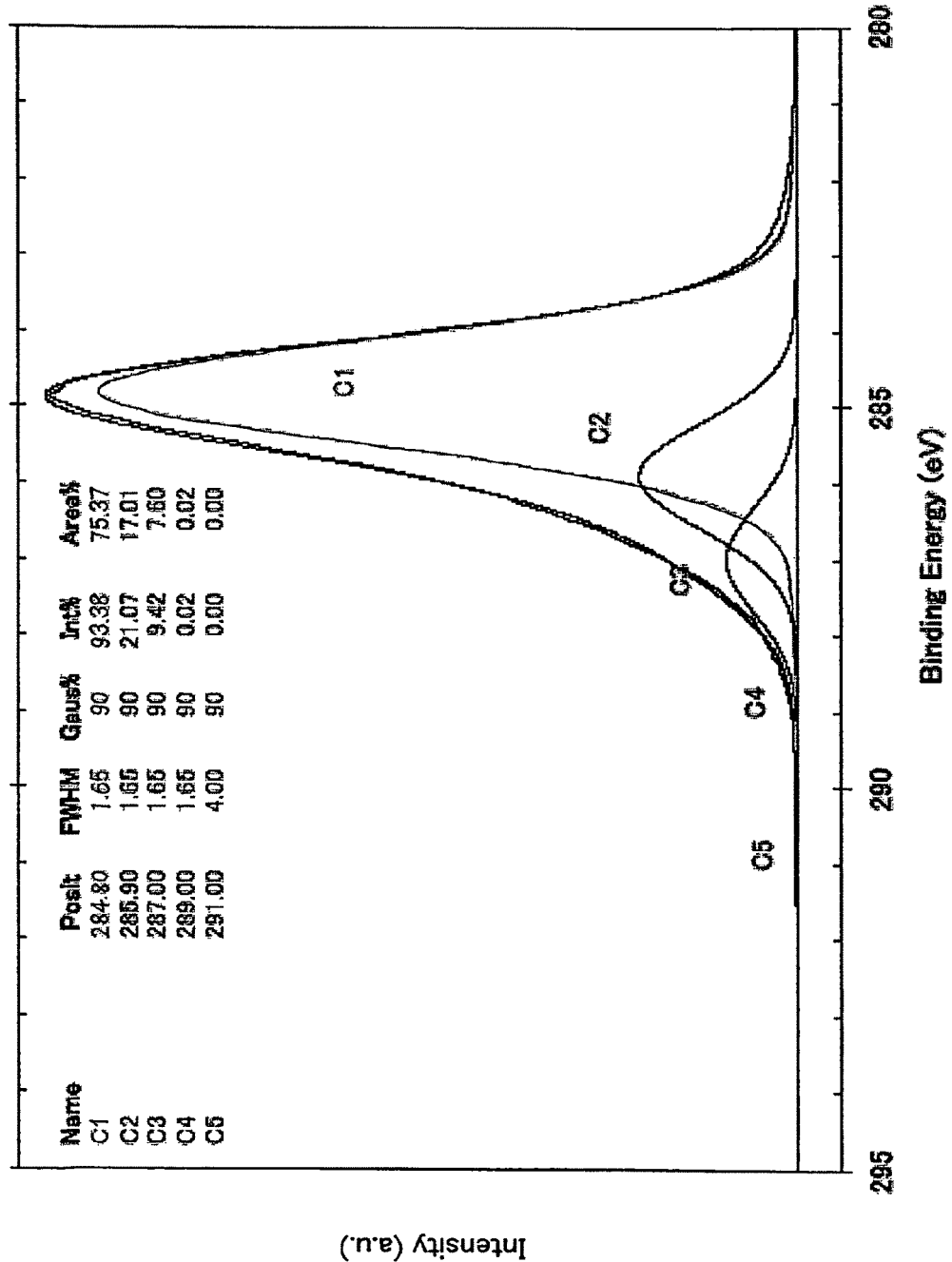
FIG. 11 is a graph showing a measurement result by ESCA of a composition including carbon nitride according to the present invention.

Furthermore, FIG. 11 shows a result by ESCA (Electron Spectroscopy for Chemical Analysis) of the sample B, which is a graph showing separated waveforms in the range of binding energy from 280 to 295 eV. Waveform C1 includes peaks of bonds such as C—C, C=C, and C—H, Waveform C2 includes peaks of C—N and C—O, Waveform C3 includes peaks of C=N and C=O, Waveform C4 includes a peak of O=C—O, and Waveform C5 is referred from a shakeup peak due to $\pi \rightarrow \pi^*$ transition. The Waveforms C1, C2, C3, C4, and C5 respectively have area ratios (Area %) of 75.37%, 17.01%, 7.60%, 0.02%, and 0%. The result proves that the sample B has a bond of C—N or C=N.

Since the thus formed composition including carbon nitride according to the present invention produces high stress relaxation, it becomes possible to deposit the composition for various objects and semiconductor devices.

Embodiment 2

The present embodiment will describe a desorption temperature of hydrogen in a composition including carbon nitride according to the present invention, which are measured by TDS (Thermal Desorption Spectroscopy) analysis.

In the TDS analysis, mass spectrum of a constituent desorbed from a sample is obtained at each temperature by mass spectroscopy of a released gas molecule while the sample is subjected to infrared heating in high vacuum. A measurement system has a background vacuum of $10^{-9}$ Torr, and sensitivity to a trace constituent can be expected. In the present embodiment, ESCO's EMD-WA1000S is used.

Figure 5:
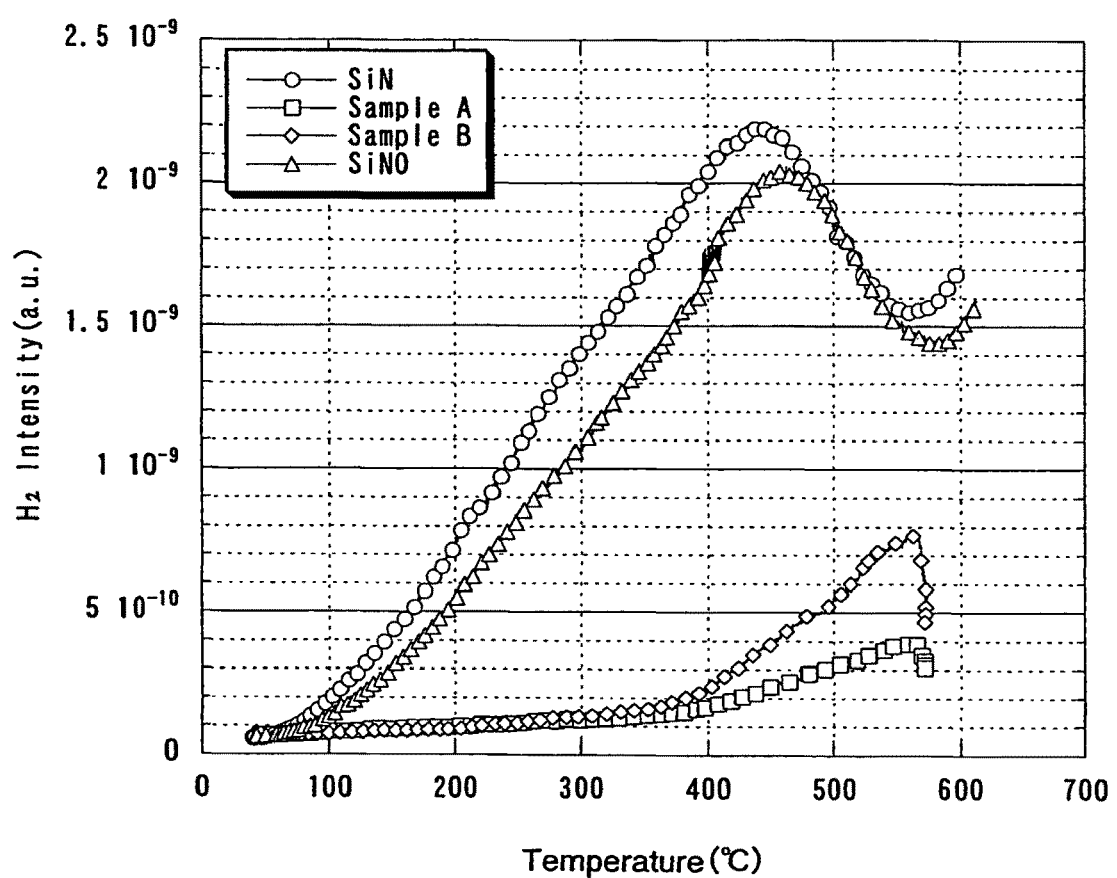
FIG. 5 is a graph showing a result of TDS analysis of a composition including carbon nitride according to the present invention.

In the present embodiment, FIG. 5 shows a comparison of results of the samples A and B that are the compositions including carbon nitride according to the present invention, which are shown in Table 1, and a silicon nitride (SiN) film and a silicon oxynitride (SiNO) film, which are formed by plasma CVD.

The results in FIG. 5 show that each of the silicon nitride and the silicon oxynitride film has a lot of hydrogen released with a peak at approximately 450° C., and on the other hand, each of the samples A and B that are the compositions including carbon nitride according to the present invention has a low intensity of hydrogen totally although the low intensity of hydrogen increases from 400° C. to 500° C. Accordingly, the results indicate that the hydrogen in the compositions including carbon nitride, which are stable, has strong bond strength.

As described above, it is hard for the hydrogen of the composition including carbon nitride according to the present invention to be released in spite of heat treatment performed. Therefore, peeling is hard to be generated, and the composition including carbon nitride according to the present invention is useful as a protective film and an insulating film that have adhesiveness.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

It is possible to form a composition including carbon nitride according to the present invention at a deposition temperature that enables to include hydrogen in the composition at 30 to 45 atomic %, for example, at temperatures of 100° C. or less, preferably 50° C. or less, more preferably from 20° C. to 30° C. Therefore, the composition including carbon nitride can be deposited without considering properties of an object to be coated, and the efficiency in deposition is improved since it is unnecessary to set the deposition temperature at a constant high temperature or to cool down.

In addition, a composition including carbon nitride according to the present invention has a hydrogen ratio from 30 to 45 atomic %, preferably, approximately 35 to 45 atomic %, and therefore, stress relaxation is enhanced. Accordingly, the composition including carbon nitride can be uniformly formed without peeling when an object to be coated has not only a shape of a planar surface but also a shape of curved surface.

Furthermore, an extremely small amount of hydrogen is released from a composition including carbon nitride according to the present invention, which has high stability. Therefore, a film with high adhesiveness, which is hard to be peeled, can be obtained. In particular, in the case of using the composition including carbon nitride as a protective film, it is possible to form the composition including carbon nitride on an object to be coated without a buffer layer interposed therebetween.

Besides, it is possible to provide a thin film transistor and a display device that have the composition including carbon nitride according to the present invention.

According to the present invention, it is possible to provide an inexpensive composition including carbon nitride, which has stable ruggedness and is appropriate for mass production. In addition, it becomes possible to apply a composition including carbon nitride, which is formed according to the present invention, to all fields.

TABLE 1

| sample | gas | condition | | | result of analysis | | |
|---|---|---|---|---|---|---|---|
| | | flow rate (sccm) | pressure (Pa) | RF power (W) | hydrogen (%) | carbon (%) | nitrogen (%) |
| A | $C_2H_2/N_2$ | 40/200 | 66 | 300 | 40.4 | 39.9 | 19.7 |
| B | $C_2H_4/N_2$ | 30/150 | 66 | 300 | 35.8 | 50.8 | 13.4 |
| C | $C_2H_4/NH_3$ | 30/300 | 133 | 200 | 35.9 | 21.4 | 42.7 |

What is claimed is:

1. A method of manufacturing a semiconductor device, comprising:
    forming a base insulating film over a substrate;
    forming a semiconductor film on the base insulating film;
    forming a gate insulating film so as to cover the semiconductor film and being in contact with the base insulating film;
    forming a gate electrode over the semiconductor film with the gate insulating film interposed therebetween;
    forming an impurity region in the semiconductor film;
    forming a first interlayer insulating film to cover the gate electrode; and
    forming a second interlayer insulating film on the first interlayer insulating film,
    wherein both of the base insulating film and the gate insulating film comprise a composition comprising carbon nitride and hydrogen,
    wherein vapor-phase growth is used with a mixture comprising carbide gas and one of nitrogen gas and nitride gas to form the composition comprising carbon nitride and hydrogen,
    wherein the composition comprising carbon nitride and hydrogen is formed at a temperature equal to or less than 100° C., and
    wherein the composition comprising carbon nitride and hydrogen comprises hydrogen from 30 to 45 atomic %.

2. A method of manufacturing a display device, comprising:
    forming a base insulating film over a substrate;
    forming a semiconductor film on the base insulating film;
    forming a gate insulating film so as to cover the semiconductor film and being in contact with the base insulating film;
    forming a gate electrode over the semiconductor film with the gate insulating film interposed therebetween;
    forming an impurity region in the semiconductor film;
    forming a first interlayer insulating film to cover the gate electrode;
    forming a second interlayer insulating film on the first interlayer insulating film,
    forming a first electrode electrically connected to the impurity region;
    forming a light-emitting layer on the first electrode;
    forming a second electrode on the light-emitting layer; and
    forming a protective film on the second electrode,
    wherein both of the base insulating film and the gate insulating film comprise a composition comprising carbon nitride and hydrogen,
    wherein vapor-phase growth is used with a mixture comprising carbide gas and one of nitrogen gas and nitride gas to form the composition comprising carbon nitride and hydrogen,
    wherein the composition comprising carbon nitride and hydrogen is formed at a temperature equal to or less than 100° C., and
    wherein the composition comprising carbon nitride and hydrogen comprises hydrogen from 30 to 45 atomic %.

3. The method of manufacturing a semiconductor device according to claim 1, wherein the composition comprising carbon nitride is formed at a temperature from 20° C. to 30° C.

4. The method of manufacturing a display device according to claim 2, wherein the composition comprising carbon nitride is formed at a temperature from 20° C. to 30° C.

5. The method of manufacturing a semiconductor device according to claim 1, wherein the first interlayer insulating film is thinner than the second interlayer insulating film.

6. The method of manufacturing a display device according to claim 2, wherein the first interlayer insulating film is thinner than the second interlayer insulating film.

7. The method of manufacturing a semiconductor device according to claim 1, wherein the substrate is a film substrate.

8. The method of manufacturing a display device according to claim 2, wherein the substrate is a film substrate.

9. The method of manufacturing a semiconductor device according to claim 1, wherein the substrate is a plastic substrate.

10. The method of manufacturing a display device according to claim 2, wherein the substrate is a plastic substrate.

* * * * *